(12) United States Patent
Shiraishi

(10) Patent No.: US 7,050,148 B2
(45) Date of Patent: May 23, 2006

(54) OPTICAL UNIT, EXPOSURE APPARATUS, AND DEVICE MANUFACTURING METHOD

(75) Inventor: Naomasa Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/997,940

(22) Filed: Nov. 29, 2004

(65) Prior Publication Data
US 2005/0068512 A1     Mar. 31, 2005

Related U.S. Application Data

(63) Continuation of application No. 10/435,353, filed on May 12, 2003, now abandoned, which is a continuation of application No. PCT/JP01/09838, filed on Nov. 9, 2001.

(30) Foreign Application Priority Data
Nov. 10, 2000   (JP)  ............................. 2000-343393

(51) Int. Cl.
G03B 27/52 (2006.01)
G03B 27/42 (2006.01)
G02B 7/02 (2006.01)
G02B 15/14 (2006.01)

(52) U.S. Cl. ........................... 355/30; 355/53; 359/509; 359/704; 359/819

(58) Field of Classification Search ................. 355/30, 355/53, 67, 77; 359/509, 513, 665, 667, 359/704, 819; 250/492.2
See application file for complete search history.

(56) References Cited

U.S. PATENT DOCUMENTS

| 4,733,945 | A | 3/1988 | Bacich |
| 5,559,584 | A | 9/1996 | Miyaji et al. |
| 5,973,764 | A | 10/1999 | McCullough et al. |
| 6,043,863 | A | 3/2000 | Ikeda |
| 6,122,114 | A | 9/2000 | Sudo et al. |
| 6,144,504 | A | 11/2000 | Sudoh et al. |
| 6,226,133 | B1 | 5/2001 | Osakabe |
| 6,239,924 | B1 | 5/2001 | Watson et al. |
| 6,285,512 | B1 * | 9/2001 | Sudoh .................. 359/704 |
| 6,288,769 | B1 | 9/2001 | Akagawa et al. |
| 6,545,746 | B1 | 4/2003 | Nishi |
| 6,583,850 | B1 | 6/2003 | Hummel et al. |

(Continued)

FOREIGN PATENT DOCUMENTS

EP    0 952 490    10/1999

(Continued)

*Primary Examiner*—Alan Mathews
(74) *Attorney, Agent, or Firm*—Oblon, Spivak, McClelland, Maier & Neustadt, P.C.

(57) ABSTRACT

In a barrel of an optical unit a ring shaped support member is integrally arranged, and three projected portions are arranged on the upper surface of the support member. The projected portions support a lower surface of a parallel flat plate supported in direct contact. In this supported state, the parallel flat plate opposes a surface of the support member with a clearance of several μm in between. With this arrangement, the space in one side of the parallel flat plate is substantially isolated from the space in the other side. Accordingly, for example, even if gas environment in the space on one side of the parallel flat plate is different from the other side, gases can be effectively kept from mixing. In addition, since the parallel flat plate is supported at three coplanar points, deformation of the parallel flat plate can be suppressed due to the force supporting the parallel flat plate, thereby suppressing the index of refraction from varying.

40 Claims, 7 Drawing Sheets

U.S. PATENT DOCUMENTS 6,633,364 B1    10/2003    Hayashi

FOREIGN PATENT DOCUMENTS

| JP | 10-144602 | 5/1998 |
| JP | 11-67651  | 3/1999 |
| JP | 11-72430  | 3/1999 |
| JP | 2000-9980 | 1/2000 |

* cited by examiner

OPTICAL UNIT, EXPOSURE APPARATUS, AND DEVICE MANUFACTURING METHOD

CROSS-REFERENCE TO RELATED APPLICATIONS

This is a continuation of International Application PCT/JP01/09838, with an international filing date of Nov. 9, 2001, the entire content of which being hereby incorporated herein by reference, which was not published in English.

BACKGROUND OF THE INVENTION

1. Field of the Invention

The present invention relates to optical units, exposure apparatus, and device manufacturing methods, and more particularly to an optical unit that has an optical path inside its barrel, an exposure apparatus that comprises the optical unit, and a device manufacturing method that uses the exposure apparatus for manufacturing electronic devices.

2. Description of the Related Art

Conventionally, various exposure apparatus have been used in a lithographic process for producing devices such as a semiconductor device and a liquid crystal display device. Among these apparatus, the ones mainly used in recent years are a reduction projection exposure apparatus (a so-called stepper) based on a step-and-repeat method, which reduces and transfers a pattern formed on a mask (also referred to as a reticle) proportionally enlarged around four to five times onto a substrate subject to exposure such as a wafer via a projection optical system, and a scanning projection exposure apparatus (a so-called scanning stepper) based on a step-and-scan method, which is an improvement of the stepper, or the like.

With these projection exposure apparatus, exposure wavelengths have shifted to a shorter range in order to achieve high resolution corresponding with finer integrated circuits. At present, a KrF excimer laser having a wavelength of 248 nm is mainly used, however, an ArF excimer laser having a shorter wavelength of 193 nm is gradually beginning to be used in practice. Furthermore, proposals are recently being made on projection exposure apparatus using an $F_2$ laser that has a shorter wavelength of 157 nm, and an $Ar_2$ laser that has a wavelength of 157 nm.

Such beams in the wavelength range called vacuum ultraviolet are strongly absorbed by almost all substances. For example, oxygen, water vapor, and almost all organic substances strongly absorb light in this region. Accordingly, in an exposure apparatus that uses vacuum ultraviolet light as its light source, the gas along the space of the optical path where the exposure light passes through needs to be replaced with a specific gas having properties of absorbing only a small amount of the vacuum ultraviolet light (hereinafter referred to as "low absorptive gas"), such as, for example with a rare gas like nitrogen or helium, so that the concentration of the absorptive gas such as the above oxygen along the space of the optical path is suppressed below several ppm.

Even when ultraviolet light which wavelength is slightly longer than that of the vacuum ultraviolet light is used (wavelength around 193 nm), oxygen is preferably removed from the optical path since the ultraviolet light will be absorbed by the oxygen.

The inside of the projection optical system should be filled with a rare gas such as nitrogen or helium, as is described above. However, helium gas is extremely effective for suppressing an increase in temperature which occurs when lenses or the like that are constituent elements of an optical system such as the projection optical system absorb the exposure light, that is, from the viewpoint of cooling effect.

The constituent elements of the projection optical system, such as the lenses, are housed in a barrel.

The refractive index of helium gas (around 1.000038), however, greatly differs from the normal refractive index of oxygen or nitrogen (around 1.000319). Therefore, when gases such as nitrogen or oxygen enter the barrel filled with helium gas from the periphery, the refractive index of the gas inside the barrel greatly changes, which greatly deteriorates image forming characteristics of the projection optical system.

In general, it is fairly easy to secure air-tightness in a barrel since it is configured of solid metal members. On both ends of the optical path on the reticle side and the wafer side, however, lenses that require an extremely high surface accuracy are arranged. So, it is not appropriate to strongly fasten and hold the lenses to increase the air-tightness, because when this happens the lenses deform greatly due to stress, which leads to a decrease in the surface accuracy.

On the other hand, an image forming optical path, which is space from the reticle through the projection optical system (projection lens) to the wafer, may be entirely filled with helium gas. When the reticle or the wafer is exchanged, however, a huge amount of helium gas is consumed (leaks outside), creating problems from the viewpoint of running cost of the exposure apparatus. In addition, the gas filled within the barrel containing absorptive gas needs to be controlled so that the concentration of the absorptive gas is lower than that of gas in the periphery of the barrel. This is because when the gas in the periphery of the barrel enters the barrel, the absorptive gas absorbs the exposure light.

SUMMARY OF THE INVENTION

The present invention has been made in consideration of the situation described above, and has as its first object to provide an optical unit capable of almost securely separating the space inside and outside the barrel or the two spaces formed inside the barrel, while maintaining its optical properties.

In addition, the second object of the present invention is to provide an exposure apparatus capable of performing exposure with high precision for over a long period of time.

And, the third object of the present invention is to provide a device manufacturing method capable of improving the productivity when high integration microdevices are produced.

According to the first aspect of the present invention, there is provided an optical unit that has an optical path for light inside a barrel, the optical unit comprising: a plate shaped transmissive optical element which transmits the light; and a first support member attached to the barrel, the first support member having a first opposing surface opposing an outer periphery portion of the optical path on a surface of the transmissive optical element, and at least three of a first projected portion arranged on the opposing surface which makes a predetermined first clearance in between the surface of the transmissive optical element and the first opposing surface, by directly supporting the transmissive optical element in at least three points.

In the optical unit, the first support member is attached to the barrel, and on a part of the first support member a first opposing surface that opposes an outer periphery portion of the optical path on a surface of the plate shaped transmissive optical element is provided. And, on the first opposing surface, a first projected portion is arranged at least at three points, which supports the transmissive optical element in direct contact at least at the three points and makes a predetermined first clearance in between the surface of the transmissive optical element and the first opposing surface. Therefore, by setting the first clearance small, the space in one side of the transmissive optical element and the space on the opposite side (the other side) can almost be separated. Accordingly, for example, even if the gas environment differs on the surface of the transmissive optical element on one side from the other side, the gases can be effectively prevented from mixing. That is, the transmissive optical element isolates the different gas environments. In addition, the transmissive optical element is supported directly in at least three points with the three first projected portions. This suppresses the transmissive optical element from deforming by the supporting force supporting the transmissive optical element, as well as the refraction of index from varying. One side of the first support member is attached to a part of the barrel, that is, to the edge of the barrel or the inside of the barrel, and the transmissive optical element is arranged on the other side of the first support member. In the former case, the transmissive optical element is attached to the edge of the barrel, whereas in the latter case, the transmissive optical element is arranged inside the barrel. Accordingly, the inside and outside of the barrel, or the two spaces inside the barrel can be isolated almost without fail, while maintaining the optical properties.

In this case, four or more first projected portions may be arranged, preferably three. In such a case, the transmissive optical element can be supported stably with the three first projected portions that have coplanar tip portions.

With the optical unit in the present invention, the shape of barrel or the transmissive optical element is not specifically limited, however the barrel can be at least partly cylindrical including a part where the first support member is attached, and the transmissive optical element can have a circular outer periphery.

In this case, the first support member can have a circular opening made that forms the optical path, and the transmissive optical element can be arranged in a state where a ring-shaped protruding portion protrudes outside the circular opening. In such a case, by decreasing the size of the space (gap) made in between the protruding portion and the first opposing surface, gas in the space on one side of the transmissive optical element and the space on the other side can be substantially kept from mixing.

With the optical unit in the present invention, when the outer periphery of the transmissive optical element has a circular shape, the transmissive optical element can be an optical element that functions as a lens.

With the optical unit in the present invention, a contact surface of the transmissive optical element with the first projected portion can be one of a planar and a curvature surface.

With the optical unit in the present invention, the first clearance can be around several times (for example, twice as much) the processing surface accuracy of the first opposing surface of the first support member. The first clearance can be adjusted easily, by adjusting the height of the first projected portions.

For example, the first clearance can be around 1 to 3 μm.

With the optical unit in the present invention, the optical unit can further include an exhaust unit that performs forced exhaustion of gas via a space formed between a surface on one side of the transmissive optical element and the first opposing surface of the first support member.

In this case, the exhaust unit can have a ring shaped exhaust groove, which is formed on the first opposing surface of the first support member, and structures a part of an exhaust route.

With the optical unit in the present invention, the optical unit can further comprise: a second support member which clamps the transmissive optical element with the first support member, the second support member having: a second opposing surface which opposes an outer periphery portion of the optical path on a surface on the other side of the transmissive optical element; and at least three of a second projected portion arranged on the second opposing surface which makes a predetermined second clearance in between the surface on the other side of the transmissive optical element and the second opposing surface, by each making contact with the transmissive optical element at positions opposing the first projected portions. In such a case, the transmissive optical element can be supported without any difficulty, and can also be kept from shifting.

In this case, the first projected portions and the second projected portions can be arranged at a position opposing each other with the transmissive optical element in between at three points.

With the optical unit in the present invention, a contact surface of the transmissive optical element with the second projected portion can be one of a planar and a curvature surface.

With the optical unit in the present invention, when the optical unit has a second support member that clamps the transmissive optical element with the first support member, the second clearance can be around several times (for example, twice as much) the processing surface accuracy of the second opposing surface of the second support member. The second clearance can be adjusted easily, by adjusting the height of the second projected portions.

For example, the second clearance can be around 1 to 3 μm.

With the optical unit in the present invention, when the optical unit has a second support member that clamps the transmissive optical element with the first support member, the barrel can be at least partly cylindrical including a part where the first support member is attached, the transmissive optical element can have a circular outer periphery, circular openings making the optical paths can be formed on the first support member and the second support member, respectively, and the transmissive optical element can be arranged in a state so as to form a ring shaped protruded portion protruding outside each of the circular openings.

In this case, the transmissive optical element can be an optical element that functions as a lens.

With the optical unit in the present invention, when the optical unit has a second support member that clamps the transmissive optical element with the first support member, the optical unit can further include an exhaust unit that performs forced exhaustion of gas via a space formed between the other side of the transmissive optical element and the second opposing surface of the second support member.

In this case, the exhaust unit can have a ring shaped exhaust groove, which is formed on the second opposing surface of the second support member and structures a part of an exhaust route.

According to the second aspect of the present invention, there is provided an exposure apparatus that exposes a substrate with an energy beam to form a predetermined pattern on the substrate, the exposure apparatus comprising: an optical unit which projects the energy beam via the pattern onto the substrate, the optical unit including a barrel which inside is an optical path of the energy beam, and a first isolating mechanism having a plate shaped first transmissive optical element transmitting the energy beam arranged on the optical path of the energy beam and a first support member attached to the barrel supporting the first transmissive optical element in at least three first supporting portions so that at least a part of the first support member opposes an outer periphery portion of the optical path on one surface of the first transmissive optical element with a predetermined first clearance in between, whereby the first mechanism isolates space in the one surface side of the first transmissive optical element from space in the other surface side of the first transmissive optical element.

With this arrangement, due to the reasons previously stated, the inside and outside of the barrel, or the two spaces inside the barrel can be isolated almost without fail, while maintaining the optical properties. Accordingly, for example, even if a low absorptive gas having the properties of absorbing a small amount of the energy beam is supplied to one of the spaces the low absorptive gas can be kept from flowing into the other space or gas inside the other space can be kept from flowing into the space, almost without fail. This allows the index of refraction to be maintained in each of the spaces, which in turn allows a pattern to be transferred onto a substrate via the optical unit with the image forming characteristics of the optical unit favorably maintained, making exposure with high precision possible for a long period of time.

In this case, each of the first supporting portions can be a projected portion provided on a surface of the first support member opposing the surface side of the first transmissive optical element.

With the exposure apparatus in the present invention, the first isolating mechanism can further have: a second support member which clamps the first transmissive optical element with the first support member by making contact directly with the other surface side of the first transmissive optical element via a second supporting portion located at a position opposing each of the first supporting portions, and at least a part of the second support member can oppose an outer periphery portion of the optical path on the other surface side of the first transmissive optical element with a predetermined second clearance in between.

In this case, each of the second supporting portions can be a projected portion provided on a surface of the second support member opposing the other surface side of the first transmissive optical element.

The first transmissive optical element is arranged on the side of the object plane or the side of the image plane of the projection optical system, which projects the predetermined pattern on the substrate. When the first transmissive optical element is arranged on the side of the object plane of the projection optical system, a second transmissive optical element is preferably arranged on the side of the image plane of the projection optical system.

With the exposure apparatus in this case, the optical unit can further include a second isolating mechanism having a plate shaped second transmissive optical element transmitting the energy beam, arranged on an image plane side of the projection optical system, and a second support member attached to the barrel, supporting the second transmissive optical element in at least three second supporting portions so that at least a part of the second support member opposes an outer periphery portion of the optical path on one surface side of the second transmissive optical element with a predetermined second clearance in between, whereby the second mechanism isolates space in the one surface side of the second transmissive optical element from space in the other surface side of the second transmissive optical element.

In this case, each of the second supporting portions can be a projected portion provided on a surface of the second support member opposing the surface side of the second transmissive optical element.

With the exposure apparatus in the present invention, the second isolating mechanism can further have: a third support member which clamps the second transmissive optical element with the second support member by making contact directly with the other surface side of the second transmissive optical element via third supporting portions located at positions opposing each of the second supporting portions, and at least a part of the third support members can oppose an outer periphery portion of the optical path on the other surface side of the second transmissive optical element with a predetermined third clearance in between.

In this case, each of the third supporting portions can be a projected portion provided on a surface of the third support member opposing the other side of the surface side of the second transmissive optical element.

With the exposure apparatus in the present invention, when the optical unit has the first isolating mechanism and the second isolating mechanism, the exposure apparatus can further comprise: a mask chamber connected in a sealed state to the barrel, the mask chamber housing within a mask on which the pattern is formed; and a substrate chamber connected in a sealed state to the barrel, the substrate chamber housing within a substrate stage on which the substrate is held, wherein low absorptive gas having low absorptive properties to the energy beam can be supplied into each of the barrel, the mask chamber, and the substrate chamber, and the first isolation mechanism can isolate the absorptive gas in between the inside of the barrel and the inside of the mask chamber, while the second isolation mechanism can isolate the absorptive gas in between the inside of the barrel and the inside of the substrate chamber. The sealed state, here, refers to a state where gaps may exist in the structure, so long as gas leaking from the mask chamber or gas leaking from the substrate chamber does not enter the barrel of the optical unit. As a matter of course, low absorptive gas may be supplied, only to the inside of the barrel.

With the exposure apparatus in the present invention, the exposure apparatus can further comprise: a mask chamber connected in a sealed state to the barrel, the mask chamber housing within a mask on which the pattern is formed, wherein low absorptive gas having low absorptive properties to the energy beam can be supplied into each of the barrel and the mask chamber, and the first isolation mechanism can isolate the absorptive gas in between the inside of the barrel and the inside of the mask chamber. The sealed state, here, refers to a state where gaps may exist in the structure, so long as gas leaking from the mask chamber does not enter the barrel of the optical unit. As a matter of course, low absorptive gas may be supplied, only to the inside of the barrel.

In this case, a flange portion that makes a holding member hold the barrel can be arranged on a periphery portion of the barrel, and a partition wall of the mask chamber can be connected to the flange portion.

With the exposure apparatus in the present invention, when the exposure apparatus comprises a mask chamber connected in a sealed state to the barrel, a flange portion that makes a holding member hold the barrel can be arranged on a periphery portion of the barrel, and the low absorptive gas can be supplied into the barrel via a supply route formed in the flange portion.

With the exposure apparatus in the present invention, when the exposure apparatus comprises a mask chamber connected in a sealed state to the barrel, the same type of gas may be supplied to the inside of the barrel and the mask chamber, or the low absorptive gas supplied into the mask chamber and the barrel may be a different type of gas.

With the exposure apparatus in the present invention, the exposure apparatus can further comprise: a substrate chamber connected in a sealed state to the barrel, the substrate chamber housing within a substrate stage on which the substrate is held, wherein low absorptive gas having low absorptive properties to the energy beam can be supplied into each of the barrel and the substrate chamber, and the first isolation mechanism can isolate the absorptive gas in between the inside of the barrel and the inside of the substrate chamber. The sealed state, here, refers to a state where gaps may exist in the structure, so long as gas leaking from the substrate chamber does not enter the barrel of the optical unit. As a matter of course, low absorptive gas may be supplied, only to the inside of the barrel.

In this case, a flange portion that makes a holding member hold the barrel can be arranged on a periphery portion of the barrel, and a partition wall of the substrate chamber can be connected to the flange portion.

With the exposure apparatus in the present invention, when the exposure apparatus comprises a substrate chamber connected in a sealed state to the barrel, the same type of gas may be supplied to the inside of the barrel and the substrate chamber, or the low absorptive gas supplied into the substrate chamber and the barrel may be a different type of gas.

With the exposure apparatus in the present invention, the energy beam can belong to light in vacuum ultraviolet region having a wavelength of 190 nm and under.

In addition, in a lithographic process, by performing exposure with the exposure apparatus in the present invention, exposure with high precision is possible for a long period of time, and the yield of high integration microdevices can be improved, thus leading to an improvement in its productivity. Accordingly, furthermore from another aspect of the present invention, there is provided a device manufacturing method using the exposure apparatus in the present invention.

DESCRIPTION OF THE PREFERRED EMBODIMENTS

Figure 1:
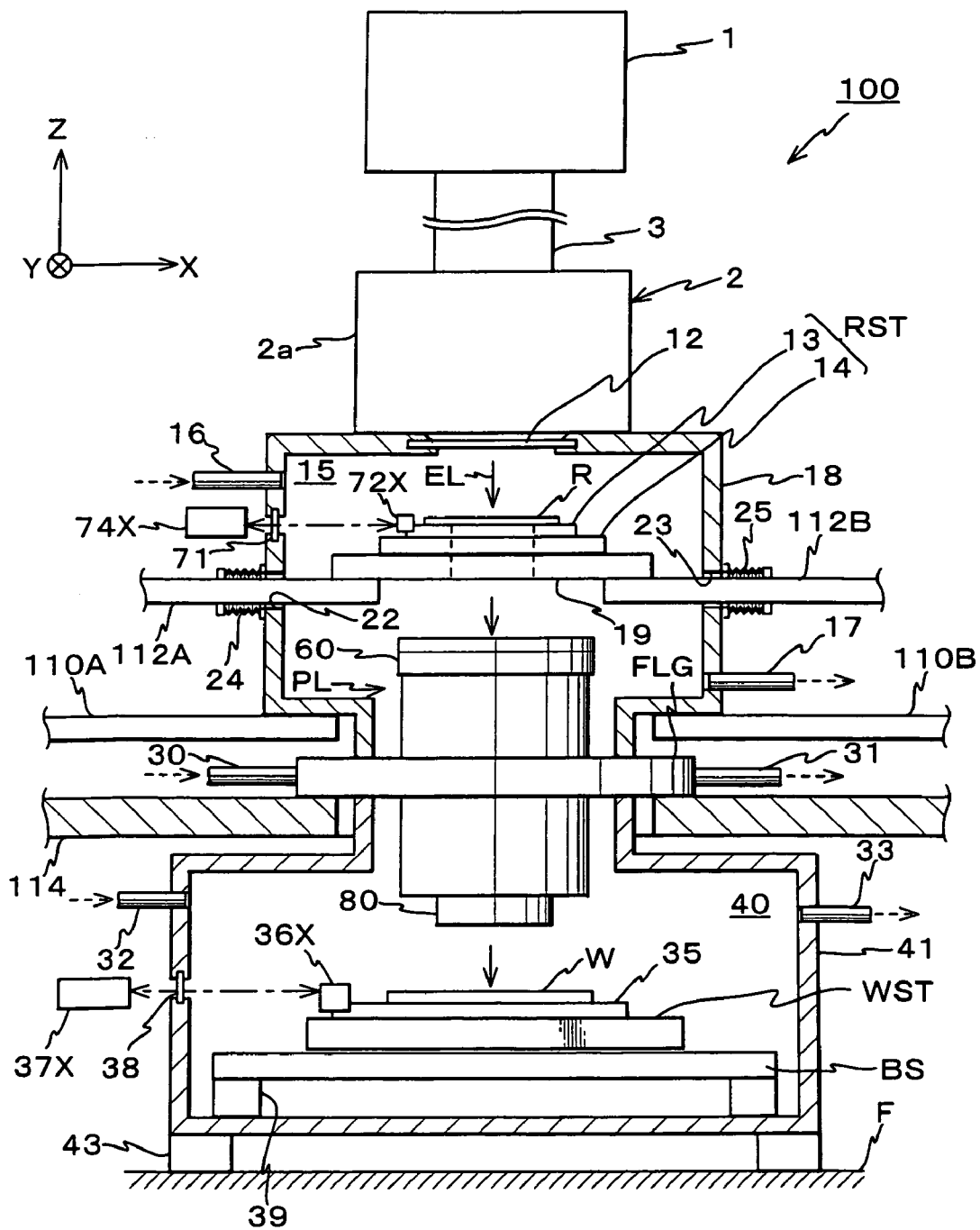
FIG. 1 is a view showing the entire configuration of an exposure apparatus related to an embodiment in the present invention.

Referring to FIGS. 1 to 4, an embodiment of the present invention is described below. FIG. 1 shows an entire configuration of an exposure apparatus 100 related to the embodiment. Exposure apparatus 100 is a projection exposure apparatus based on a step-and-scan method, that is, a so-called scanning stepper. Exposure apparatus 100 illuminates an illumination light for exposure (hereinafter referred to as "exposure light") EL serving as an energy beam that belongs to a vacuum ultraviolet region onto a reticle R serving as a mask, and transfers a pattern formed on the reticle R onto a wafer W serving as a substrate via a projection optical system PL serving as an optical unit.

Exposure apparatus 100 includes a light source 1 and an illumination unit 2. Exposure apparatus 100 also comprises: an illumination system for illuminating the reticle R with exposure light EL; a reticle stage RST for holding the reticle R; projection optical system PL for projecting exposure light EL emitted from the reticle R onto the wafer W; a wafer stage WST for holding the wafer W, and the like.

As light source 1, a light source that emits light in the vacuum ultraviolet region having a wavelength of around 120 nm to 190 nm, such as the fluorine laser ($F_2$ laser) having an output wavelength of 157 nm is used in the embodiment. Of course, other light sources emitting light in the vacuum ultraviolet region, such as a Krypton dimer laser ($Kr_2$ laser) having an output wavelength of 146 nm or an Argon dimer laser ($Ar_2$ laser) having an output wavelength of 126 nm may be used, as well as light sources emitting light in the deep ultraviolet region such as the ArF excimer laser having an output wavelength of 193 nm, or a KrF excimer laser having an output wavelength of 248 nm.

Light source 1 is connected to one end of an illumination system housing 2a making up illumination unit 2 via a light transmission optical system (beam line) 3, which includes an optical system called a beam matching unit for optical axis adjustment. Light source 1 is actually arranged in a service room which degree of cleanliness is lower than that of a clean room where illumination unit 2 and an exposure apparatus main body including projection optical system PL or the like are arranged, or in a utility space available underneath the floor of the clean room.

Illumination unit 2 comprises: an illumination housing 2a for isolating the inside from the outside; and an illumination optical system made up of an illuminance uniformity optical system including an optical integrator, a relay lens, a variable ND filter, a reticle blind, a dichroic mirror, and the like (all of them not shown) that are arranged inside illumination housing 2 in a predetermined positional relationship. This illumination optical system is configured similarly to the ones disclosed in, for example, Japanese Patent Application Laid-open No. 10-112433, Japanese Patent Application Laid-open No. 06-349701 and its corresponding U.S. Pat. No. 5,534,970 or the like. A fly-eye lens, a rod integrator (an internal reflection type integrator), a diffractive optical element, or the like can be used as the optical integrator. As long as the national laws in designated states or elected states, to which this international application is applied, permit, the disclosures cited above are fully incorporated herein by reference.

Illumination unit 2 illuminates a slit shaped illumination area (set by the reticle blind) on the reticle R on which a circuit pattern or the like is formed by exposure light EL with an illuminance substantially uniform.

When using light that has a wavelength in the vacuum ultraviolet region as the exposure light, gases that have a strong absorptivity to light in such wavelength range (hereinafter referred to as "absorptive gas" as appropriate), such as oxygen, water vapor, or gases containing hydrocarbon need to be removed from its optical path. Therefore, in the embodiment, the inside of the illumination system housing 2a is filled with a specific gas that has low absorptivity to light in the vacuum ultraviolet region (hereinafter referred to as "low absorptive gas" as appropriate), such as nitrogen, helium, or a rare gas such as Argon, Neon, or Krypton, or a mixed gas containing such gases. As a result, concentration of the absorptive gas within illumination system housing 2a is less than several ppm.

Likewise illumination system housing 2a, in the embodiment, low absorptive gas is filled in light source 1 and along an optical path inside light transmission optical system 13.

Reticle stage RST holds the reticle R, and is arranged within a reticle chamber 15 serving as a mask chamber. Reticle chamber 15 is covered with a partition wall 18, which joins illumination system housing 2a and a flange portion FLG provided around the center of the barrel of projection optical system PL in the height direction without any gap, so that the gas inside is isolated from the outside. Partition wall 18 of reticle chamber 15 is formed of a material such as stainless (SUS), which releases only a small amount of gas when degassed.

Partition wall 18 of reticle chamber 15 and projection optical system PL are joined at flange portion FLG of projection optical system PL for the following reasons. That is, flange portion FLG is a mount to make a barrel supporting bed (mainframe) 114, which will be described later, hold projection optical system PL. It is also the strongest part in projection optical system PL mechanically; therefore, even when projection optical system PL is under stress of any kind when partition wall 18 is joined, deformation in projection optical system PL can be suppressed to the minimum, making flange portion FLG an excellent connecting portion. Metal bellows or a softer film-shaped member can also be used to further decrease vibration from traveling to flange portion FLG via partition wall 18, which occurs with the movement of the reticle stage RST.

As such film-shaped members, a member can be used that comprises, for example, a thin film consisting of a first material that has good shielding properties against gas, a thin film consisting of a second material releasing only a small amount of gas when degassed, which is arranged on one surface of thin film of the first material (an inner surface in a state where thin film is attached in between partition wall 18 and flange portion FLG), and a thin film consisting of a third material that has good expansion properties and is arranged on the other surface of thin film of the first material (an outer surface in the above attached state). Of the three thin films, the thin films consisting of the first material and the second material are laminated (multilayer processing), and the thin film consisting of the third material is applied to the outer surfaces. For example, materials such as ethylene vinyl alcohol copolymer (EVOH resin), polyamide, polyimide, or polyester that have good shielding properties against gas and are flexible can be used for the thin film consisting of the first material. In addition, materials such as aluminum (Al), other kinds of metal, or ceramics that have low reactivity to the exposure light such as the vacuum ultraviolet light as in inorganic substances and release only a small amount of gas when degassed can be used for the thin film consisting of the second material. Furthermore, materials such as polyethylene ($-(CH_2CH_2)_n-$) or polypropylene can be used for the thin film consisting of the third material.

As is shown in FIG. 1, reticle chamber 15 is supported from below by support members 110A and 110B or the like. Furthermore, in the ceiling portion of partition wall 18 of reticle chamber 15, a small rectangular opening is formed, which is slightly smaller than the reticle R. In the opening, a light transmittance window 12 is arranged so as to separate the space inside illumination system housing 2a and that of the reticle chamber 15 where the reticle R to be exposed is arranged. Since light transmittance window 12 is arranged on the optical path of exposure light EL emitted from illumination unit 2 to the reticle R, it is made of a crystal material that has high transmittance to vacuum ultraviolet light serving as the exposure light, such as fluorite.

Reticle stage RST is structured so that it drives the reticle R linearly with large strokes on a reticle base supporting bed 19, and it can also drive the reticle R finely in the Y-axis direction and the θz direction (rotational direction around the Z-axis).

More particularly, reticle stage RST comprises a reticle scanning stage 14, which is driven in the X-axis direction with predetermined strokes on reticle base supporting bed 19 by a reticle drive system (not shown) that includes a linear motor or the like, and a reticle holder 13 which holds the reticle R mounted on reticle scanning stage 14 by suction. Reticle holder 13 is structured finely drivable (including rotation) within the XY plane by the reticle drive system.

A low absorptive gas such as nitrogen flows into the inside of reticle chamber 15 at all times. This is because in an exposure apparatus that uses exposure wavelength in the vacuum ultraviolet region, the vicinity of the reticle R needs to be replaced with low absorptive gas so as to prevent an absorptive gas such as oxygen from absorbing the exposure light. Thus, concentration of absorptive gas in reticle chamber 15 is also less than several ppm.

As is shown in FIG. 1, one end of a gas supply pipeline 16 and an exhaust pipeline 17 are each connected to partition wall 18 of reticle chamber 15. The other end of gas supply pipeline 16 and exhaust pipeline 17 are each connected to a nitrogen gas supply unit (not shown). Nitrogen gas having high purity is supplied to reticle chamber 15 from the nitrogen gas supply unit via gas supply pipeline 16 at all times, whereas the gas within reticle chamber 15 is collected by the nitrogen gas supply unit via exhausting pipeline 17. The nitrogen gas is circulated and used in such manner. The nitrogen gas supply unit incorporates a gas purifying unit, and the gas purifying unit operates so as to maintain concentration of gases other than the nitrogen gas (that is, absorptive gases such as oxygen, water vapor, or organic substances) less than several ppm, even when the nitrogen gas is circulated and used for over a long period of time in a circulation route including the nitrogen gas supply unit and the inside of reticle chamber 15. Sensors such as a pressure sensor or an absorptive gas concentration sensor may be arranged within reticle chamber 15, and based on measurement values of the sensor, the start/stop operation of a pump incorporated in the nitrogen gas supply unit can be controlled appropriately via a control unit (not shown).

In addition, on a part of partition wall 18 of reticle chamber 15, openings 22 and 23 are arranged as is shown in FIG. 1 (on both sides in the X-axis direction in FIG. 1). Support members 112A and 112B or the like are inserted in the openings 22 and 23 from the outside, to horizontally support reticle base supporting bed 19. Also, metal bellows 24 and 25, which are freely expandable, are each arranged on the external portion of openings 22 and 23 in partition wall 18; in order to decrease the amount of vibration from traveling to projection optical system PL via support members 112A, 112B, and partition wall 18 which occurs in reticle base supporting bed 19 when reticle stage RST moves, and also to prevent gas leakage from openings 22 and 23. Incidentally, it is possible to use a softer film-shaped member similar to the one described earlier, instead of the metal bellows.

On the side wall in the −X side of partition wall 18 of reticle chamber 15, a light transmittance window 71 is arranged. Likewise, although it is omitted in the drawings, a light transmittance window is also arranged on the side wall in the +Y side (in depth of the page surface in FIG. 1) of partition wall 18. These light transmittance windows are structured, by forming windows (opening portions) in partition wall 18 and attaching light transmitting members to close the openings, a normal optical glass in the embodiment. When the windows are formed, in order to prevent gas leakage from an attachment portion of the light transmitting member configuring light transmittance window 71 to the window opening, sealing with a metal seal such as indium or copper, or a fluorocarbon resin is applied to the attachment portion. As the above fluorocarbon resin, a fluorocarbon resin that has been degassed by undergoing heat treatment for two hours at a temperature of 80° c. is preferably used.

On the edge portion on the −X side of reticle holder 13, an X movable mirror 72X consisting of a planar mirror is arranged, extending in the Y-axis direction. On X movable mirror 72X, measurement beams from an X-axis laser interferometer 74X arranged outside reticle chamber 15 almost at a right angle to X movable mirror 72X are projected, via light transmittance window 71. A detector which receives the light reflected off X movable mirror 72X via light transmittance window 71 is arranged within the X-axis laser interferometer 74X, thus detecting a position of the X movable mirror 72X, that is, an X position of the reticle R, with a position of a reference mirror arranged within the X-axis laser interferometer 74X as a reference.

Similarly, although it is omitted in the drawings, on the edge portion on the +Y side of reticle holder 13, a Y movable mirror consisting of a planar mirror is arranged, extending in the X-axis direction. And, similar as above, a position of Y movable mirror, that is, a Y position of reticle R is detected with a Y-axis interferometer (not shown) via Y movable mirror. Detection values (measurement values) of the above two laser interferometers are supplied to a control unit (not shown), and the control unit controls the position of reticle stage RST based on the detection values of these interferometers.

As is described, in the embodiment, since the laser interferometer, that is; the laser light source, optical members such as a prism, and the detector or the like, are arranged outside reticle chamber 15, there are no adverse effects on exposure even if a small amount of absorptive gas is generated from parts making up the laser interferometers such as the detector.

As projection optical system PL, an optical system that is both a double telecentric reduction optical system and a refraction optical system consisting of a plurality of lens elements (formed of fluorite, or fluorite crystal such as in lithium fluoride) having a common optical axis in the Z-axis direction, is used. Projection optical system PL has a projection magnification β of, for example, ¼ or ⅕. As is previously described, when reticle R is illuminated with exposure light EL from illumination unit 2, projection optical system PL reduces and projects the circuit pattern formed on reticle R on the shot areas of wafer W, transferring and forming reduced images of the circuit pattern.

Projection optical system PL is inserted from a lateral direction in an opening that has a U shape in a planar view, formed in barrel supporting bed (mainframe) 114. It is fixed to barrel supporting bed (mainframe) 114 via the above flange portion FLG. Other than the refraction optical system referred to earlier, a catadioptric system or a reflection system may either be used as projection optical system PL.

In addition, in the embodiment, in order to prevent vibration from traveling in between support members 110A and 110B which support partition wall 18 of reticle chamber 15, support members 112A and 112B which support reticle base supporting bed 19, and barrel supporting bed 114 which support projection optical system PL, a vibration cancel mechanism (not shown) is provided in between these members.

In addition, in the embodiment where light source 1 is a vacuum ultraviolet light such as the $F_2$ laser having an output wavelength of 157 nm, gases along the optical path inside projection optical system PL need to be replaced with a rare gas such as helium, or with nitrogen gas (low absorptive gas) that have low absorptivity to vacuum ultraviolet light. Also, in an exposure apparatus that uses vacuum ultraviolet light as its light source, materials used for lenses in projection optical system PL are limited to a crystal material such as fluorite that has a large thermal expansion coefficient. Accordingly, of the low absorptive gas referred to above, since the increase in temperature which occurs when the lenses absorb exposure light EL greatly affects the image forming characteristics or the like of the lenses, helium gas which has a large cooling effect is used in this embodiment.

Helium gas, however, has a large index of refraction to nitrogen and air. So, even if only a slight amount of nitrogen gas within reticle chamber 15 or in wafer chamber 40 (which will be described later) enters the inside of projection optical system PL filled with helium gas, the index of refraction of the helium gas within projection optical system PL changes greatly, thus deteriorating the image forming characteristics of projection optical system PL, which decreases the apparatus performance. Therefore, in this embodiment, a mechanism is employed where helium gas within projection optical system PL is almost completely separated with nitrogen gas outside; in the upper end portion (end portion on the +Z side) and the lower end portion (end portion on the −Z side) of projection optical system PL. The configuration of projection optical system PL, including the mechanism for separating helium gas and nitrogen gas will be described in detail, later in the description.

Wafer stage WST is arranged in wafer chamber 40, which serves as a substrate chamber. Wafer chamber 40 is covered with a partition wall 41 joined with the barrel of projection optical system PL without any gap, which isolates the gas inside from the outside. Partition wall 41 of wafer chamber 40 is formed of a material such as stainless (SUS), which releases only a small amount of gas when degassed.

Similar with partition wall 18 of reticle chamber 15, partition wall 41 of wafer chamber 40 and projection optical system PL are joined at flange portion FLG of projection optical system PL. This is due to similar reasons as to why partition wall 18 of reticle chamber 15 is joined to flange portion FLG.

Inside wafer chamber 40, a base BS is horizontally supported via a plurality of vibration isolation units 39. In addition, partition wall 41 of wafer chamber 40 is supported on a floor surface F by a plurality of vibration isolation units 43. Vibration isolation units 43 insulate fine vibration from the floor at a micro G level, while vibration isolation units 39 suppress vibration of base BS traveling through partition wall 41 to projection optical system PL, which occurs due to the movement of wafer stage WST.

Wafer stage WST can be driven freely in XY two dimensional directions on an upper surface of base BS by, for example, a wafer drive system (not shown) made up of a linear motor or the like.

In an exposure apparatus that uses exposure wavelength in the vacuum ultraviolet region as in the embodiment, the optical path from projection optical system PL to the wafer W also needs to be replaced with nitrogen or rare gas, in order to prevent the exposure light from being absorbed by absorptive gases such as oxygen.

As is shown in FIG. 1, one end of a gas supply pipeline 32 and an exhaust pipeline 33 are each connected to partition wall 41 of wafer chamber 40. The other end of gas supply pipeline 32 and exhaust pipeline 33 are each connected to a nitrogen gas supply unit (not shown). Nitrogen gas having high purity is supplied to wafer chamber 40 from the nitrogen gas supply unit via gas supply pipeline 32 at all times, whereas the gas within wafer chamber 40 is collected by the nitrogen gas supply unit via exhausting pipeline 33. The nitrogen gas is circulated and used in such manner. The nitrogen gas supply unit incorporates a gas purifying unit, and the gas purifying unit operates so as to maintain concentration of gases other than the nitrogen gas (that is, absorptive gases such as oxygen, water vapor, or organic substances) less than several ppm, even when the nitrogen gas is circulated and used for over a long period of time in a circulation route including the nitrogen gas supply unit and the inside of wafer chamber 40. Sensors such as a pressure sensor or an absorptive gas concentration sensor may be arranged within wafer chamber 40, and based on measurement values of the sensor, the start/stop operation of a pump incorporated in the nitrogen gas supply unit can be controlled appropriately via a control unit (not shown).

On the side wall in the −X side of partition wall 41 of wafer chamber 40, a light transmittance window 38 is arranged. Likewise, although it is omitted in the drawings, a light transmittance window is also arranged on the side wall in the +Y side (in depth of the page surface in FIG. 1) of partition wall 41. These light transmittance windows are structured, by forming windows (opening portions) in partition wall 41 and attaching light transmitting members to close the openings, a normal optical glass in the embodiment. When the windows are formed, in order to prevent gas leakage from an attachment portion of the light transmitting member configuring light transmittance window 38 to the window opening, sealing with a metal seal such as indium or copper, or a fluorocarbon resin is applied to the attachment portion. As the above fluorocarbon resin, a fluorocarbon resin that has been degassed by undergoing heat treatment for two hours at a temperature of 80° c. is preferably used.

On the edge portion on the −X side of a wafer holder 35, an X movable mirror 36X consisting of a planar mirror is arranged, extending in the Y-axis direction. On X movable mirror 36X, measurement beams from an X-axis laser interferometer 37X arranged outside wafer chamber 40 almost at a right angle to X movable mirror 36X are projected, via light transmittance window 38. A detector which receives the light reflected off X movable mirror 36X via light transmittance window 38 is arranged within the X-axis laser interferometer 37X, thus detecting a position of the X movable mirror 36X, that is, an X position of the wafer R, with a position of a reference mirror arranged within the X-axis laser interferometer 37X as a reference.

Similarly, although it is omitted in the drawings, on the edge portion on the +Y side of wafer holder 35, a Y movable mirror consisting of a planar mirror is arranged, extending in the X-axis direction. And, similar as above, a position of Y movable mirror, that is, a Y position of wafer W is detected with a Y-axis interferometer (not shown) 37Y via Y movable mirror. Detection values (measurement values) of the above two laser interferometers are supplied to a control unit (not shown), and the control unit controls the position of wafer stage WST based on the detection values of these interferometers.

As is described, in the embodiment, since the laser interferometer, that is; the laser light source, optical members such as a prism, and the detector or the like, are arranged outside wafer chamber 40, there are no adverse effects on exposure even if a small amount of absorptive gas is generated from parts making up the laser interferometers such as the detector.

A configuration of projection optical system PL will be described next in detail, referring to FIGS. 2 to 4.

Figure 2:
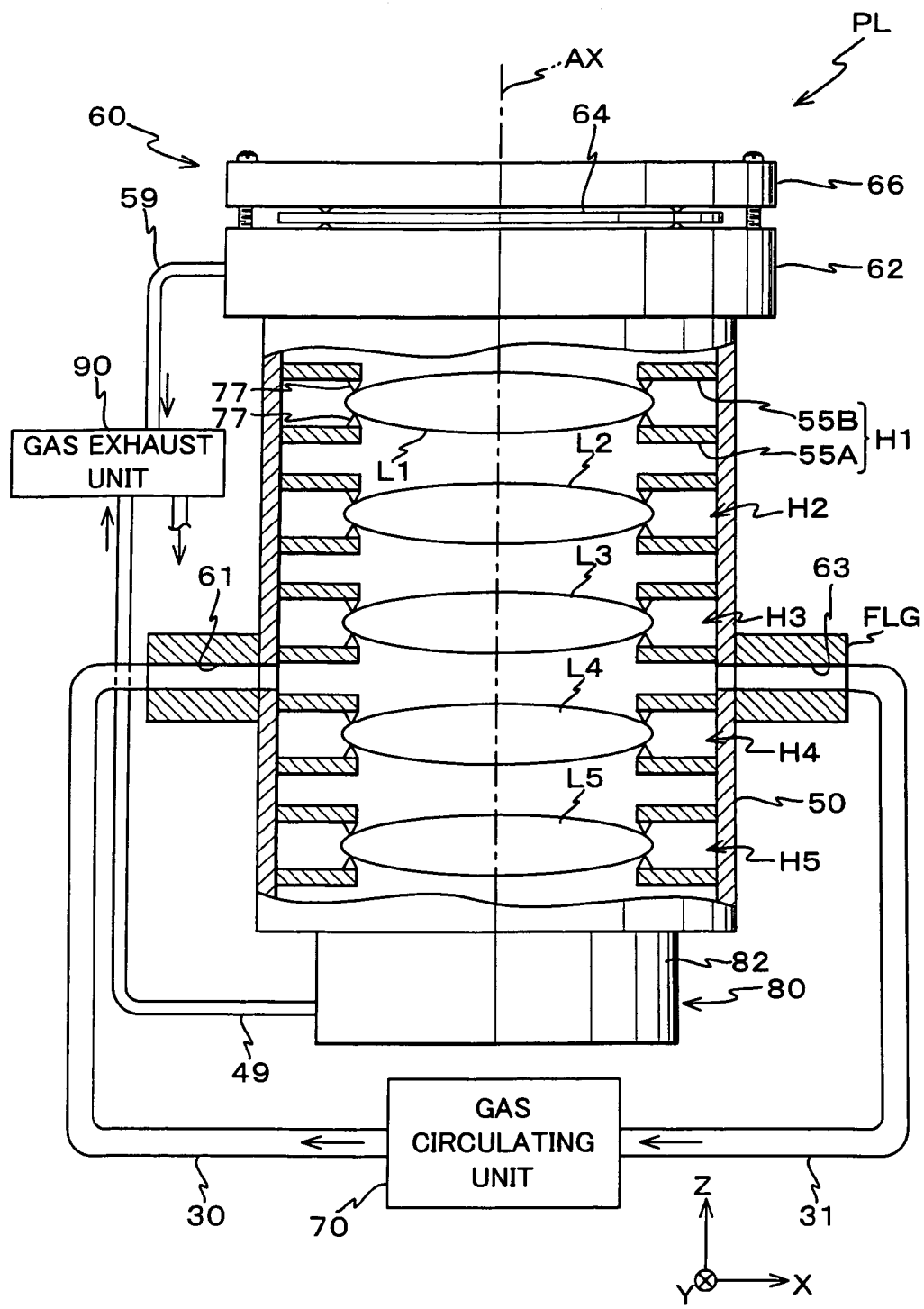
FIG. 2 is a view of a barrel portion of a projection optical system in FIG. 1 sectioned, shown with gas piping of the projection optical system.

In FIG. 2, a side view of projection optical system PL is schematically shown with its barrel partly broken, along with a gas piping system. FIG. 3 shows a partly sectional perspective view of the vicinity of an upper end of a projection optical system PL.

As is shown in FIG. 2, projection optical system PL comprises a barrel 50, a plurality of lenses (five in FIG. 2) L1, L2, L3, L4, and L5 that are arranged within barrel 50 at a predetermined interval.

On the inner periphery surface of barrel 50, lens holding mechanisms H1, H2, H3, H4, and H5 for holding the periphery portion of each lens in point contact from a vertical direction are arranged vertically at a predetermined interval. Lens holding mechanisms H1 to H5 are each arranged on the inner periphery surface of barrel 50 at an equiangular interval at a plurality of points.

In flange portion FLG of projection optical system PL, a gas supply path 61 and a gas exhaust path 63 are each formed in a state connecting the inside with the outside of projection optical system PL, as is shown in FIG. 2. One end of a gas supply pipeline 30 and an exhaust pipeline 31 are connected, respectively, to gas supply path 61 and gas exhaust path 63 from outside projection optical system PL. The other end of gas supply pipeline 30 is connected to one end of a gas circulating device 70, which supplies helium gas into projection optical system PL and exhaust the gas inside projection optical system PL, whereas, the other end of exhaust pipeline 31 is connected to the other end of gas circulating device 70.

Gas circulating device 70 replaces the gas inside barrel 50 of projection optical system PL at all times with helium gas having high purity, by creating a flow of helium gas into projection optical system PL via gas supply pipeline 30 and exhaust pipeline 31. This allows absorptive gas inside barrel 50 of projection optical system PL to be maintained at a concentration less than several ppm at all times. Furthermore, gas circulating device 70 incorporates a gas purifying unit (not shown), which operates to maintain absorptive gas inside barrel 50 of projection optical system PL at a concentration less than several ppm at all times so that helium gas can be circulated and used for over a long period of time in a circulation route including the gas circulating device 70 and the inside of barrel 50 of projection optical system PL. Sensors such as a pressure sensor or an absorptive gas concentration sensor may be arranged within barrel 50, and based on measurement values of the sensor, the start/stop operation of a pump incorporated in gas circulating device 70 may be controlled appropriately via a control unit (not shown).

The reason for performing gas supply/exhaustion via flange portion FLG is since flange portion FLG is mechanically strong, it can suppress influence of vibration traveling to projection optical system PL via gas supply pipeline 30 and exhaust pipeline 31, which are connected to flange portion FLG and carry helium gas, to the minimum.

In addition, in the embodiment, in between a first isolating mechanism 60 (to be described later) and a second isolating mechanism 80 in barrel 50, space inside the barrel is sealed to the outside, creating a sealed structure. Even when the barrel is structured of stacked partial barrels, a seal member made of fluorocarbon resin may be arranged in between the partial barrels, or a spacer having an exhaust groove formed may be arranged, so that the space inside the barrel is isolated from the outside.

As is shown in FIG. 2, the first isolating mechanism 60 is arranged on the upper end portion of barrel 50, to substantially suppress gas flowing from barrel 50 of projection optical system PL to reticle chamber 15 (refer to FIG. 1) connected in close contact with projection optical system PL, as well as substantially suppress gas from flowing into projection optical system PL from reticle chamber 15. Following are the details on the first isolating mechanism 60, referring to FIG. 3.

Figure 3:
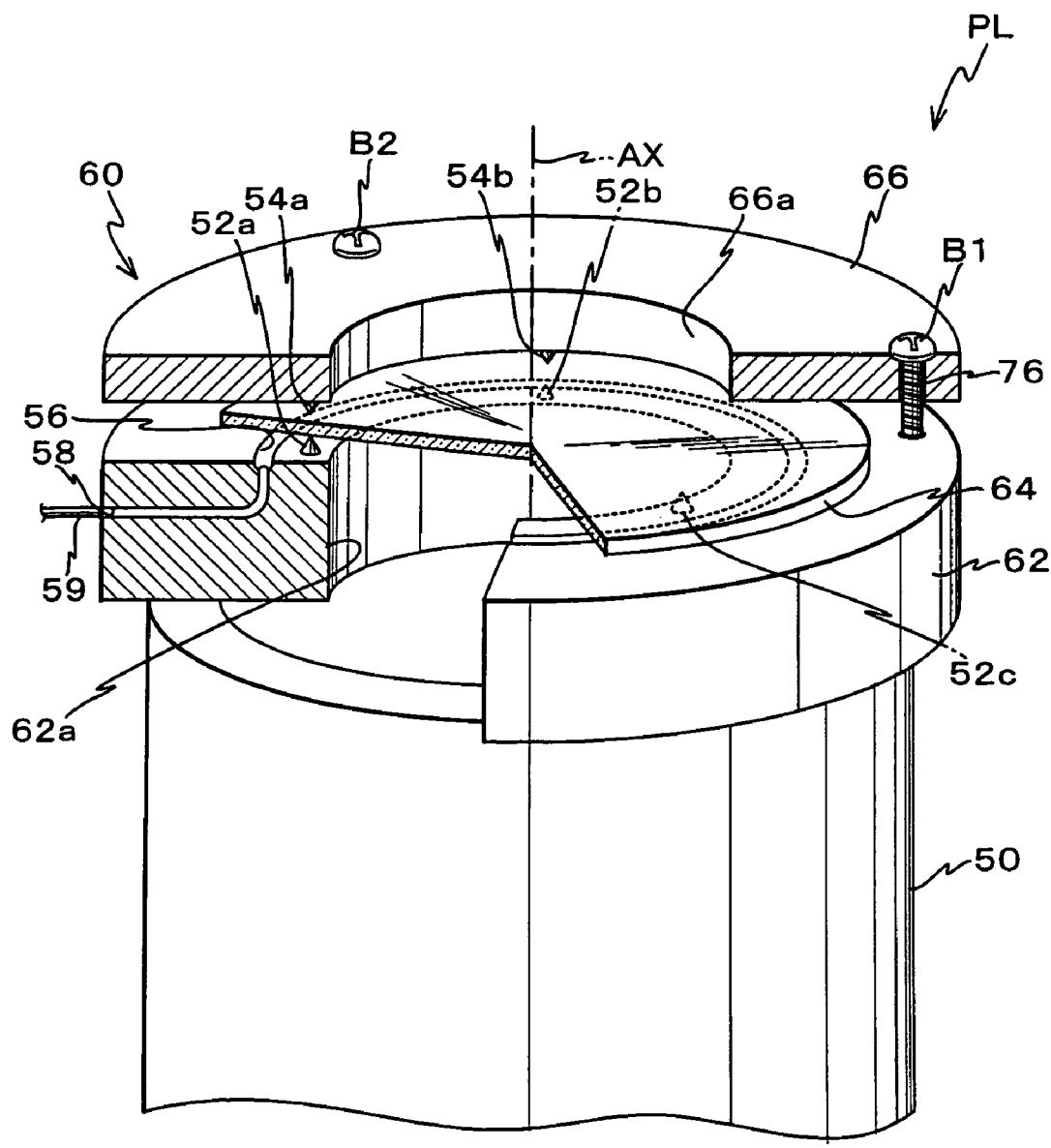
FIG. 3 is a partly sectioned perspective view of an upper end portion of a projection optical system.

As is shown in FIG. 3, the first isolating mechanism 60 comprises a first holding member 62 serving as a support member arranged integrally on the upper end portion of barrel 50 (object surface side of projection optical system PL), a partition wall parallel plate 64 serving as a transmissive optical element consisting of a circular parallel flat plate arranged above the first holding member 62 via a predetermined clearance, and a second holding member 66 serving as a support member arranged above the partition wall parallel plate 64 via a predetermined clearance.

The first holding member 62 is a ring shaped member of a predetermined thickness, on which a circular penetrating hole 62a is formed in the center. The penetrating hole 62a is an optical path of the exposure light EL, and on the upper surface of the first holding member 62, three projected portions 52a, 52b, and 52c are arranged at an equiangular interval on the same circumference. Projected portions 52a to 52c, for example, are projected above the upper end surface of the first holding member 62 around 2 to 5 µm, which is just about double the processing accuracy of the upper end surface of the first holding member 62 of 1 to 2 µm. In addition, in the area on the outer side of projected portions 52a to 52c on the upper surface of the first holding member 62, an exhaust groove 56 of a circular ring shape is formed, with an optical axis AX as its center. Exhaust groove 56 is connected through to an exhaust pipeline 59 via a gas exhaust path 58, which is formed in the first holding member 62. And, one end of exhaust pipeline 59 is connected to the side surface of the first holding member 62.

Similar to lenses L1 to L5 described above, partition wall parallel plate 64 is made up of fluorite crystal such as in fluorite or lithium fluoride, and the surface accuracy is set extremely high compared with the first holding member 62. The three projected portions 52a to 52c, arranged on the upper surface of the first holding member 62, support the lower surface of partition wall parallel plate 64 at three points in direct contact. Accordingly, in this supporting state a clearance of around several times (favorably twice as much) to the processing surface accuracy of the first holding member 62 is secured in between the upper end surface of the first holding member 62 and partition wall parallel plate 64.

In addition, in the supporting state, the portion of the first holding member 62 in contact with the lower surface of the partition wall parallel plate 64 is limited to the tip portion of projected portions 52a to 52c, and the three tip portions set a plane on which the lower surface of the partition wall parallel plate 64 is held. Therefore, with projected portions 52a to 52c, the degree of flatness of the partition wall parallel plate 64 can be maintained, without the shape of the lower surface deforming in any way like the shape of the upper end surface of the first holding member 62 having processing errors when holding the partition wall parallel plate 64 in direct contact with the upper end surface of the first holding member 62. Accordingly, optical properties such as the index of refraction can be maintained, without any unnecessary stress on partition wall parallel plate 64.

In addition, the radius of partition wall parallel plate 64 is several cm longer than the radius of penetrating hole 62a formed in the center of the first holding member 62. Therefore, when partition wall parallel plate 64 is supported by projected portions 52a to 52c of the first holding member 62 in a state where the center of partition wall parallel plate 64 coincides with the optical axis AX, as is shown in FIG. 3, an area in a strip several cm wide from the circumference of partition wall parallel plate 64 faces the upper end surface of the first holding member 62 via a clearance of around several µm (1–3 µm). Accordingly, ventilation between reticle chamber 15 and the inside of projection optical system PL is limited only to the circular space around several µm high and several cm wide, creating an extremely high airtight state.

Likewise the first holding member 62, the second holding member 66 is a ring shaped member for clamping partition wall parallel plate 64 with the first holding member 62. On the second holding member 66 a circular penetrating hole 66a, which is an optical path of the exposure light EL, is formed. And on the lower surface of the second holding member 66, three projected portions 54a, 54b, and 54c are arranged (projected portion 54c is not shown, due to drawing convenience) in the same positional relationship as projected portions 52a to 52c described earlier. In an assembled state, as in FIG. 3, projected portions 54a to 54c of the second holding member 66 face projected portions 52a to 52c formed on the upper surface of the first holding member 62 in the vertical direction with partition wall parallel plate 64 in between. With this arrangement, since forces in the vertical direction act on the same position in a horizontal plane (the point of action is coaxial), forces that cause deformation of the partition wall parallel plate 64 are not generated.

In such a case, as well, the height of projected portions 54a to 54c is around 2–5 µm, which is around twice the processing surface accuracy of the lower surface of the second holding member 66 around 1–2 µm. Accordingly, a clearance of around several times (favorably twice as much) to the processing surface accuracy of the second holding member 66 is secured in between the lower end surface of the second holding member 66 and the upper surface of partition wall parallel plate 64.

Furthermore, in the embodiment, in order to securely hold (clamp) partition wall parallel plate 64 with the first holding member 62 and the second holding member 66, holes 76 are formed in the second holding member 66 at a predetermined interval as is shown in FIG. 3, and screw holes (openings with screws, not shown) are formed on the first holding member 62 on the area opposing holes 76. Then, screws B1 and B2 are each screwed into the screw holes via each of the holes 76 and are tightened as appropriate, so that the second holding member 66 is fixed to the first holding member 62.

As is shown in FIG. 2, the other end of exhaust pipeline 59 is joined to a gas exhaust unit 90. Gas exhaust unit 90 is joined to a gas storage chamber (not shown), and exhausts the exhausted gas flowing into the device via exhaust pipeline 59 to the gas storage chamber (not shown).

With the first isolating mechanism 60 having the structure described above, since the first holding member 62 and the second holding member 66 hold partition wall parallel plate 64 with a space of several micron available in between, gas flowing in and out of projection optical system PL (barrel 50) via the space in between partition wall parallel plate 64 and the first holding member 62 can be suppressed to the minimum. Also, nitrogen gas that passes slightly through the first holding member 62 and partition wall parallel plate 64 flowing into projection optical system PL and helium gas that flows slightly out of projection optical system PL are forced outside projection optical system PL and reticle chamber 15. This is performed by gas exhaust unit 90 via exhaust groove 56, which is formed in the first holding member 62 at a position opposing partition wall parallel plate 64. Accordingly, in the embodiment, gas inside projection optical system PL and reticle chamber 15 can be kept from mixing, almost without fail.

In the vicinity of the lower end of barrel 50 of projection optical system PL (image plane side of projection optical system PL), the second isolating mechanism 80 is arranged, which is structured similar to the first isolating mechanism 60. Hereinafter, the second isolating mechanism 80 is described, referring to FIG. 4. FIG. 4 shows a perspective view partially sectioned, of the second isolating mechanism 80 detached from projection optical system PL.

Figure 4:
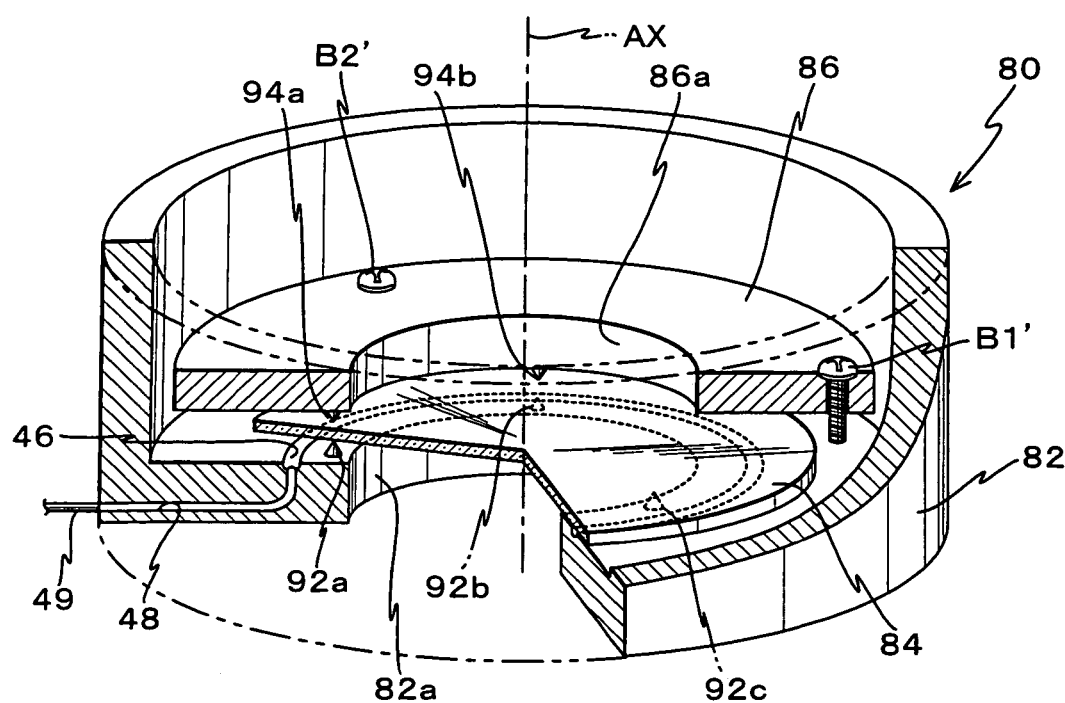
FIG. 4 is a partly sectioned perspective view of a second isolating mechanism.

As is shown in FIG. 4, the second isolating mechanism 80 comprises: a third holding member 82 which serves as a support member, consisting of a cylindrical shaped member with a bottom on which a circular penetrating hole 82a (forms the optical path of the exposure light EL) is formed in the center; a partition wall parallel plate 84 serving as a transmissive optical element consisting of a circular parallel flat plate arranged above the third holding member 82 via a clearance of around several µm; and a fourth holding member 86 serving as a support member arranged above the partition wall parallel plate 84 via a clearance of around several µm.

The upper end of the third holding member 82 is fixed to the lower end portion of barrel 50 of projection optical system PL (refer to FIG. 2). Likewise the first holding member 62, the third holding member 82 supports partition wall parallel plate 84 at three points with projected portions 92a, 92b, and 92c that are formed on the upper surface of its bottom wall. Also, partition wall parallel plate 84 is a circular parallel flat plate, formed with a similar material in a similar way as partition wall parallel plate 64.

The fourth holding member 86 is a ring shaped member that has projected portions 94a, 94b, and 94c (projected portion 54c is not shown, due to drawing convenience) formed on its lower surface for clamping partition wall parallel plate 84 in the vertical direction with projected portions 92a, 92b, and 92c of the third holding member 82. On the fourth holding member 86 a circular penetrating hole 86a, which is an optical path of the exposure light EL, is formed. This allows forces in the vertical direction to act on the same position in a horizontal plane (the point of action is coaxial); therefore, forces that cause deformation of the partition wall parallel plate 84 are not generated. The fourth holding member 86 is fixed to the third holding member 82 in a similar manner as above, with screws B1' and B2'.

In such a case, again, the height of projected portions 92a to 92c is around 2–5 µm, which is around twice the processing surface accuracy of the upper surface of the third holding member 82 around 1–2 µm. Similarly, the height of projected portions 94a to 94c is around 2–5 µm, which is around twice the processing surface accuracy of the lower surface of the fourth holding member 86 around 1–2 µm. Accordingly, a clearance of around 1–3 µm is set; in between the upper surface of the third holding member 82 and partition wall parallel plate 84, and in between the lower surface of the fourth holding member 86 and partition wall parallel plate 84.

In addition, the radius of partition wall parallel plate 84 is several cm longer than the radius of penetrating hole 82a formed in the center of the third holding member 82. Therefore, when partition wall parallel plate 84 is supported by projected portions 92a to 92c of the third holding member 82 in a state where the center of partition wall parallel plate 84 coincides with the optical axis AX, as is shown in FIG. 4, partition wall parallel plate 84 faces the upper surface of the third holding member 82 via a clearance of around several µm (1–3 µm). Accordingly, ventilation between wafer chamber 40 and the inside of projection optical system PL is limited only to the circular space around several µm high and several cm wide, creating an extremely high airtight state.

In addition, in the outer side area of projected portions 92a to 92c on the upper surface of the third holding member 82, an exhaust groove 46 of a circular ring shape is formed with the optical axis AX as its center. Exhaust groove 46 is connected through to an exhaust pipeline 49 via a gas exhaust path 48, which is formed in the third holding member 82. And, one end of exhaust pipeline 49 is connected to the side surface of the third holding member 82, and the other end is connected to gas exhaust unit 90 previously referred.

With the second isolating mechanism 80 having the structure described above, since the third holding member 82 and the fourth holding member 86 hold partition wall parallel plate 84 with a space of several micron vertically available in between, gas flowing in and out of projection optical system PL via the space in between partition wall parallel plate 84 and the third holding member 82 can be suppressed to the minimum. Also, gas that passes slightly through the third holding member 82 and partition wall parallel plate 84 flowing into projection optical system PL and gas that flows slightly out of projection optical system PL (into wafer chamber 40) are exhausted outside projection optical system PL and wafer chamber 40 via exhaust groove 46, which is formed in the third holding member 82 at a position opposing partition wall parallel plate 84. Accordingly, in the embodiment, gas inside projection optical system PL and wafer chamber 40 can be kept from mixing, almost without fail.

In addition, in the embodiment, since ring shaped exhaust grooves are provided in the first holding member and the third holding member on the surfaces facing the partition wall parallel plates, gas within the space enclosed by each of the partition wall parallel plate and the holding member can be exhausted evenly by exhausting gas via the ring shaped grooves. As a consequence, a high sealed effect can be obtained with a small exhaust amount.

As is obvious from the description so far, in the embodiment, exhaust groove 56, gas exhaust path 58, exhaust pipeline 59, and gas exhaust unit 90 make up an exhaust unit for eliminating gas. Likewise, exhaust groove 46, gas exhaust path 48, exhaust pipeline 49, and gas exhaust unit 90 also make up an exhaust unit for eliminating gas.

Incidentally, at least one of partition wall parallel plates 64 and 84 is one of a plurality of optical elements structuring the projection optical system. The projection optical system is designed, taking into account the aberration occurring due to the attachment of partition wall parallel plates 64 and 84 in advance.

In addition, in the description above, the structure is employed where nitrogen gas supply units for reticle chamber 15 and wafer chamber 40 incorporate gas purifying units. However, the present invention is not limited to this, and gas exhausted from reticle chamber 15 and wafer chamber 40 can be exhausted via factory piping, instead of having the gas purifying units incorporated. A similar arrangement may be employed for gas circulating device 70, provided in projection optical system PL.

In addition, in the embodiment, the inner surface of barrel 50 and the surface inside the first holding member to the fourth holding member are, for example, preferably coated with fluorocarbon resin. Or, on the inner surface of barrel 50 and the surface inside the first holding member to the fourth holding member, a hard film (such as a ceramics film or a stainless film) which releases only a small amount of gas when degassed is preferably formed by plasma spray coating, or a chemically clean processing is preferably performed by electric field polishing. Or, as the material of the inner surface of barrel 50 and the surface inside the first holding member to the fourth holding member, chemically clean materials such as stainless or Teflon (registered trademark) may be used.

In addition, the four clearances in total, that is, the clearances formed on the upper surface side and the lower surface side of the partition wall parallel plates 64 and 84, may each be the same or be different. That is, the first to third clearances related to the present invention may be the same or may be different.

Next, exposure operations performed by the exposure apparatus 100 having the arrangement described above is briefly described.

First of all, various exposure conditions are set. After this is completed, preparatory operations such as reticle alignment and baseline measurement are performed, using equipments such as a reticle microscope (not shown) and an off axis alignment sensor (also not shown). Then, fine alignment (such as EGA (Enhanced Global Alignment)) on wafer W is performed using the alignment sensor, and arrangement coordinates of a plurality of shot areas on wafer W are obtained.

Details on the preparatory operations such as the reticle alignment and the baseline measurement referred to above are disclosed in, for example, Japanese Patent Application Laid-open No. 04-324923 and the corresponding U.S. Pat. No. 5,243,195. Details on EGA that follow the preparatory operations are disclosed in, Japanese Patent Application Laid-open No. 61-44429 and the corresponding U.S. Pat. No. 4,780,617. As long as the national laws in designated states or elected states, to which this international application is applied, permit, the disclosures cited above are fully incorporated herein by reference.

When the preparatory operations for exposing wafer W is completed in the manner above, a control unit (not shown) moves wafer stage WST to the starting position for scanning exposure on the first shot area on wafer W via the wafer drive system based on the alignment results, while monitoring the measurement values of X-axis laser interferometer 37X and Y-axis laser interferometer 37Y on the wafer side.

Then, the control unit begins scanning reticle stage RST and wafer stage WST via the reticle drive system and the wafer drive system in the X direction. When both stages RST and WST reach their target scanning velocity, exposure light EL begins illuminating the pattern area of reticle R. Thus scanning exposure begins.

The control unit synchronously controls reticle stage RST and wafer stage WST via the reticle drive system and the wafer drive system, so that a movement velocity Vr of reticle stage RST in the X-axis direction and a movement velocity Vw of wafer stage WST in the X-axis direction are maintained at a velocity ratio corresponding to the projection magnification of projection optical system PL, especially during scanning exposure described above.

Then, different areas of the pattern area of reticle R are sequentially illuminated with the ultraviolet pulse light, and when the entire pattern area has been illuminated, scanning exposure on the first shot area on wafer W is completed. And, with the operation above, the circuit pattern of reticle R is reduced and transferred on the first shot area via projection optical system PL.

When scanning exposure on the first shot area is completed in the manner above, the control unit steps wafer stage WST in both the X-axis and Y-axis directions, so as to move it to the scanning starting position for exposing the second shot area. During the stepping operations, the control unit measures the positional shift of wafer stage WST in the X, Y, and θz directions realtime based on the measurement values of X-axis laser interferometer 37X and Y-axis laser interferometer 37Y on the wafer side. And, based on the measurement results, the control unit controls the position of wafer stage WST so that the XY positional shift is in a predetermined state.

The control unit then performs scanning exposure in the manner described above on the second shot area.

In this manner, scanning exposure on the shot area on wafer W and stepping operations for exposing the next shot area are repeatedly performed, and the circuit pattern of reticle R is sequentially transferred onto all the shot areas on wafer W subject to exposure.

When scanning exposure is performed in the manner above on each of the shot areas on the wafer, the exposure apparatus can fully demonstrate its optical properties due to the first isolating mechanism 60 and the second isolating mechanism 80. That is, since helium gas is supplied to projection optical system PL, whereas nitrogen gas is supplied to reticle chamber 15 and wafer chamber 40, and furthermore, nitrogen gas flowing into projection optical system PL is almost totally prevented, the index of refraction of gas inside projection optical system PL is almost constant. Therefore, the image forming characteristics of projection optical system PL can be favorably maintained for a long period. Also, since helium gas flowing out of projection optical system PL into reticle chamber 15 and wafer chamber 40 can be almost totally prevented, the index of refraction of gas inside both the stage chambers 15 and 40 is maintained at a constant level. Moreover, since deformation of partition wall parallel plates 64 and 84 is suppressed, optical properties of partition wall parallel plates 64 and 84 such as the index of refraction can be maintained for a long period, therefore, partition wall parallel plates 64 and 84 hardly have any adverse effects on the exposure accuracy.

Furthermore, even with the elapse of time, image forming characteristics of projection optical system PL hardly deteriorates, and changes in the index of refraction of gas filling reticle chamber 15 and wafer chamber 40 are suppressed. Accordingly, deterioration in the pattern transferred onto wafer W can be prevented.

As is described so far, with the exposure apparatus 100 in the embodiment, a pattern is transferred onto each shot area on wafer W via projection optical system PL which image forming characteristics are favorably maintained. In addition, since exposure is performed with exposure light EL, which is light in the vacuum ultraviolet region, projection optical system PL can have high resolution, allowing a fine pattern to be accurately transferred onto a wafer. Accordingly, exposure with high precision can be maintained for a long period of time.

The exhaust units may be provided in the second and fourth holding members located above the partition wall parallel plate, that is, grooves may be formed on the lower surface side of the second and fourth holding members for exhausting gas. Or, in order to increase the seal effect, the grooves may be arranged on both the upper and lower surface of the light transmitting members.

In the embodiment above, the first isolating mechanism 60 is arranged at the very top on the upper end of projection optical system PL and the second isolating mechanism is arranged at the very bottom end, so as to isolate the gas environment inside barrel 50 from the gas environment outside barrel 50. The present invention, however, is not limited to this, and the first isolating mechanism 60, for example, does not necessarily have to be at the very top on the upper end of projection optical system PL, and may be arranged at a position several lenses inward from the reticle R side. Similarly, the second isolating mechanism 80 may be arranged at a position several lenses inward from the wafer W side of projection optical system PL.

With this arrangement, the holding mechanism for normal lenses is to hold the lenses only partially by point contact so as to prevent the lenses from deforming, as is described above. Therefore, the space around the lenses arranged above the first isolating mechanism 60 and the space around the lenses arranged below the second isolating mechanism 80 are filled with nitrogen gas, like the inside of reticle chamber 15 and wafer chamber 40. Even in such a case, the two spaces inside barrel 50 can be isolated, almost without fail.

Positional controllability of wafer W is tighter by reduction magnification of the projection optical system (for example, ¼ or ⅕) than positional controllability of reticle R. This means that the interferometer measuring the position of wafer stage WST on which wafer W is mounted requires a higher accuracy. Therefore, the optical path of the interferometer measuring the position of wafer W may be replaced with helium gas, which has a small index of refraction and reduces the change in wavelength corresponding to the change in pressure or temperature (fluctuations). Accordingly, in the embodiment above, wafer chamber 40 may be filled with helium gas, as is with projection optical system PL, and in this case, since the gas in projection optical system PL and wafer chamber 40 is the same, the necessity of arranging the second isolating mechanism 80 like the embodiment above decreases. However, it is preferable to keep the arrangement of the second isolating mechanism 80 to maintain the purity of the replaced gas in projection optical system PL, since the gas atmosphere of wafer chamber 40 is frequently disturbed due to situations such as maintenance operations of wafer stage WST or the like and wafer exchange. Likewise, reticle chamber 15 may be filled with helium gas, and also in this case, the first isolating mechanism 60 does not necessarily have to be arranged.

However, it is preferable to keep the arrangement of the first isolating mechanism 60 to maintain the purity of the replaced gas in projection optical system PL, since the gas atmosphere of reticle chamber 15 is frequently disturbed due to situations such as maintenance operations of reticle stage RST or the like and reticle exchange.

In addition, since drive portions such as stage mechanisms are located in the wafer chamber 40 and reticle chamber 15, concentration of absorptive gas inside wafer chamber 40 and reticle chamber 15 is controlled higher than that of the inside of projection optical system PL. In this case, even if the type of low absorptive gas within wafer chamber 40 or reticle chamber 15 is the same as the low absorptive gas inside projection optical system PL, concentration of absorptive gas inside projection optical system PL can be maintained lower than that of the inside of wafer chamber 40 and reticle chamber 15 when at least either the first isolating mechanism 60 or the second isolating mechanism 80 is provided.

When the KrF excimer laser or the ArF excimer laser is used as the light source, reticle chamber 15 and wafer chamber 40 or the like do not necessarily have to be arranged. Even with such an arrangement, the first isolating mechanism 60 and the second isolating mechanism 80 function effectively, so that the purity of the replaced gas in projection optical system PL is maintained.

The second and fourth holding members 66 and 86 in the first isolating mechanism 60 and the second isolating mechanism 80 that clamp (hold) partition wall parallel plates 64 and 84 from above do not necessarily have to be provided, and the first and third holding members 62 and 82 may merely support light transmitting members 64 and 84 from below.

Figure 5A:
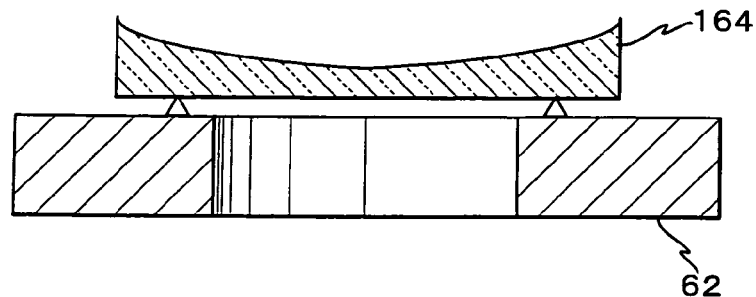
FIGS. 5A to 5C are views showing modified examples of a partition wall parallel plate.
Figure 5B:
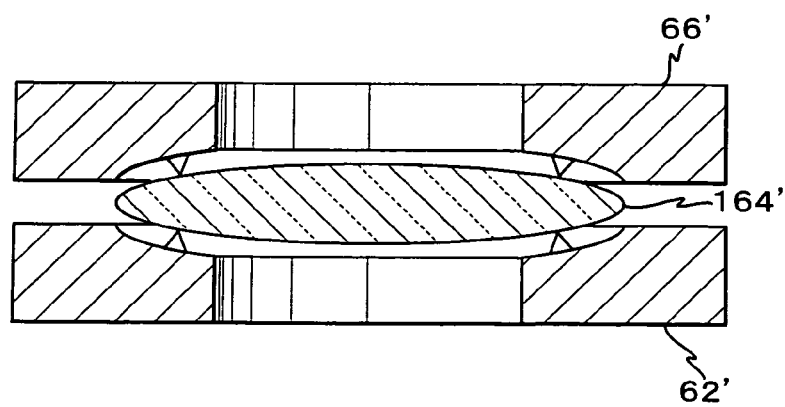
Figure 5C:
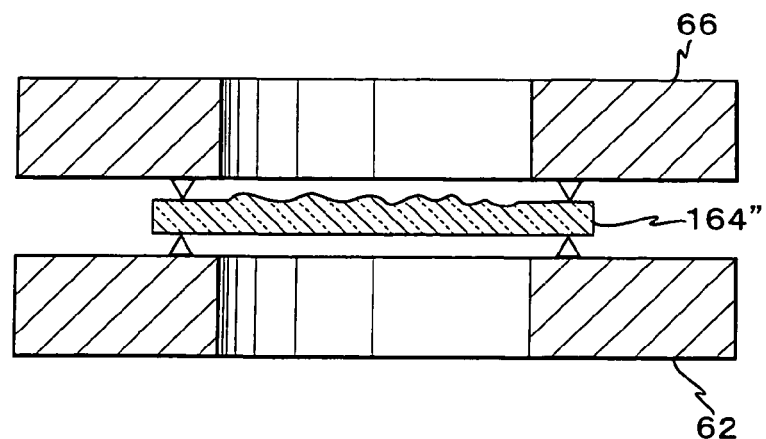

In addition, in the embodiment above, the shape of the partition wall parallel plate is flat. The present invention, however, is not limited to this, and the partition wall parallel plate may be a plano-convex or a plano-concave lens 164, having a slight curvature as is shown in FIG. 5A. In such a case, when the flat surface side is arranged on the lower side, the first holding member 62 can be used without any modification, making it convenient from the viewpoint of processing the holding members. Or, a lens 164' that has a curvature on both surfaces can be used as is shown in FIG. 5B, with a premise that holding members (62' and 66') holding the partition wall parallel plate are processed to have a curvature almost the same as the curvature of the lens. Furthermore, a member 154" which is overall flat but locally processed irregularly on the optical path for exposure can be used, as is shown in FIG. 5C. In such a case, holding members used in the embodiment above (62 and 66) can be used without any modification. A so-called aberration correction member (plate) is typical for a member having such a shape, and by using the aberration correction member image forming characteristics (for example, aberration such as distortion) can be favorably corrected. When the aberration correction member having the irregular shape is used, aberration such as distortion of projection optical system PL is measured in advance, and the surface of the aberration correction member is processed so that and the aberration is corrected based on the measurement results.

In addition, in the embodiment above, exhaust grooves 46 and 56 formed in the first holding member and the third holding member is a single groove. However, two or more exhaust grooves may be formed concentrically for eliminating gas separately, so as to prevent gas from mixing further. Moreover, when a plurality of exhaust grooves are provided the grooves may be arranged on the inner side and the outer side of projected portions 52*a* to 52*c*, so that projected portions 52*a* to 52*c* come between the grooves.

In addition, in the embodiment above, the case has been described where a first isolating mechanism and a second isolating mechanism are provided in the projection optical system, however, this is not limited only to the projection optical system, and the isolating mechanism can be employed in the illumination optical system. In such a case, the isolating mechanism can be arranged instead of light transmittance window 12 shown in FIG. 1.

In addition, in the embodiment above, a circular shaped member is employed as the partition wall parallel plate. The present invention, however, is not limited to this, and the partition wall parallel plate may have a different shape other than a circular shape, so long as it is large enough to cover the exhaust grooves formed in the first and third holding members. Also, the shape of the exhaust grooves is not limited to the ring shape described in the embodiment above, and it may be elliptical or polygonal, or in the shape of an racetrack. Furthermore, the shape of the grooves is not limited to these shapes without any edges (closed shape), and can have a shape with an edge such as in the letter C; that is, a shape without any edges as is described above partially chipped. In this case, from the viewpoint of uniform exhaustion, the size of the chipped portion is preferably small so that the groove can be considered a shape without any edges.

Partition wall parallel plates 64 and 84 that structure the first and second isolating mechanisms are supported, respectively, with three projected portions. Thus, deformation of partition wall parallel plates 64 and 84 can be predicted in advance, and the image forming state of the projection optical system due to the deformation can be adjusted (as an adjustment mechanism, a part of a plurality of optical elements structuring the projection optical system is moved). Also, even when partition wall parallel plates 64 and 84 are exchanged (partition wall parallel plate 84 has to be exchanged regularly in particular, since outgas such as organic materials generated from the resist adhere on partition wall parallel plate 84), since partition wall parallel plates 64 and 84 are each supported with three projected portions, attachment reproducibility to the barrel can be obtained.

In addition, in the embodiment above, projected portions to hold the lenses and partition wall planar plates are provided at three points in all cases. The present invention, however, is not limited to this, and projected portions may be provided at four points instead.

In addition, in the embodiment above, as the gas exhaust unit for eliminating gas, a structure of forming exhaust grooves in the first and third holding members at the position facing the partition wall parallel plates and using the grooves to eliminate gas is employed. The gas exhaust unit related to the present invention, however, is not limited to this. Also, if sufficient air-tightness can be achieved, by both narrowing the space between the partition wall parallel plate and each of the holding members and increasing the area size where they face one another, exhaust mechanism using exhaust grooves or the like can be omitted. And, also in the case when gas pressure within projection optical system PL is set higher than that of the mask chamber or wafer chamber at an extent where the partition wall parallel plate does not deform, the exhaust mechanism can be omitted.

In addition, the material of the lenses (glass material) structuring projection optical system PL also needs to differ depending on the light source. When an ArF excimer light source or a KrF excimer light source is used, both synthetic quartz and fluorite may be used for the lenses, however, when a light source in the vacuum ultraviolet region such as an $F_2$ laser light source is used, all the lenses must be made of fluorite.

The following materials may be used other than fluorite: crystals such as lithium fluoride, magnesium fluoride, strontium fluoride, lithium-calcium-aluminum-fluoride, or lithium-strontium-aluminum-fluoride; fluorinated glass made of zirconium-barium-lanthanum-aluminum; improved quartz such as fluorine doped silica glass, fluorine and hydrogen doped silica glass, silica glass containing hydroxyl radicals, silica glass containing fluorine and hydroxyl radicals, or the like.

In addition, the light source of the exposure apparatus in the embodiment above is not limited to the $F_2$ laser light source, ArF excimer light source, or the KrF excimer light source. For example, a harmonic may also be used, which is obtained by amplifying a single-wavelength laser beam in the infrared or visible range oscillated by a DFB semiconductor laser or fiber laser with a fiber amplifier doped with erbium (or both erbium and ytteribium), and by converting the wavelength into ultraviolet light using a nonlinear optical crystal. Furthermore, the magnification of the projection optical system is not limited to a reduction system, and an equal magnification system or an enlarged magnification system may also be used.

In addition, when a catadioptric type projection optical system is used as the projection optical system, for example, a catadioptric system having a beam splitter and a concave mirror serving as a reflection optical element can be used, which details are disclosed in Japanese Patent Application Laid-open No. 08-171054 and the corresponding U.S. Pat. No. 5,668,672, and in Japanese Patent Application Laid-open No. 10-20195 and the corresponding U.S. Pat. No. 5,835,275, or the like. Or, a catadioptric system that does not use a beam splitter and has a concave mirror serving as a reflection optical element can be used, which details are disclosed in Japanese Patent Application Laid-open No. 08-334695 and the corresponding U.S. Pat. No. 5,689,377, and in the International Application Publication WO01/65296 and the corresponding U.S. patent application Ser. No. 769,832 (Filing date: 2001, Jan. 26). As long as the national laws in designated states or elected states, to which this international application is applied, permit, the disclosures cited above are fully incorporated herein by reference.

Or, a catadioptric system may be used which details are disclosed in, U.S. Pat. Nos. 5,031,976, 5,488,229, and 5,717,518. This system has a plurality of refraction optical elements and two mirrors (a main mirror and a sub-mirror; the main mirror being a concave mirror, and the sub mirror being a rear mirror which reflection surface is formed on the opposite side of the incident surface of a refraction element or a parallel flat plate) arranged coaxially, and can re-image an intermediate image of a reticle pattern formed by the plurality of refraction optical elements on the wafer with the main mirror and the sub-mirror. In this catadioptric system, the main mirror and the sub-mirror are arranged successively to the plurality of refraction optical elements. The illumination light passes through a part of the main mirror and then is reflected off the sub-mirror and the main mirror, further proceeding through a part of the sub-mirror and then reaching the wafer. As long as the national laws in designated states or elected states, to which this international application is applied, permit, the disclosures cited above are fully incorporated herein by reference.

Furthermore, as the catadioptric type projection optical system, for example, a reduction system that has a circular image field and is telecentric on both the object side and the image plane side, with a projection magnification of ¼ or ⅕ may be used. In addition, when a scanning exposure apparatus comprises such catadioptric type projection optical system, the projection optical system may be of the type which irradiation area of the illumination light is located within the field of the projection optical system with its center around an optical axis, and the irradiation area set in a rectangular slit shape extending along a direction almost perpendicular to the scanning direction of the reticle or the wafer. With a scanning exposure apparatus comprising such a catadioptric type projection optical system, it is possible to accurately transfer a fine pattern of around 100 nm L/S pattern, even for example, when an $F_2$ laser beam having a wavelength of 157 nm is used as the illumination light for exposure.

In the embodiment above, the case has been described where the present invention is applied to a scanning exposure apparatus based on a step-and-scan method, however, the scope of the present invention is not limited to this. That is, the present invention can be suitably applied to a reduction projection exposure apparatus based on a step-and-repeat method.

In addition, as the flotation method of wafer stage WST and reticle stage RST, as a matter of course, instead of magnetic flotation, a method using the flotation force of gas flow can be employed. In such a case, gas used for floating the stage is preferably nitrogen gas filled in each stage chamber.

An exposure apparatus related to the present invention such as the exposure apparatus 100 in the embodiment above can be built by incorporating the illumination optical system made up of a plurality of lenses and the projection optical system into the main body of the exposure apparatus and performing optical adjustment, while incorporating the wafer stage (and the reticle stage in the case of a scanning exposure apparatus) that are made up of various mechanical components into the main body of the exposure apparatus, connecting the wiring and piping, assembling each of the partition walls configuring the reticle chamber and the wafer chamber, connecting the gas piping system, connecting each portion to the control system such as the main controller, and furthermore, performing total adjustment (electrical adjustment, operational adjustment). The exposure apparatus is preferably made in a clean room where temperature, degree of cleanliness, and the like are controlled.

<<Device Manufacturing Method>>

An embodiment of a device manufacturing method using the exposure apparatus above in a lithographic process is described next.

Figure 6:
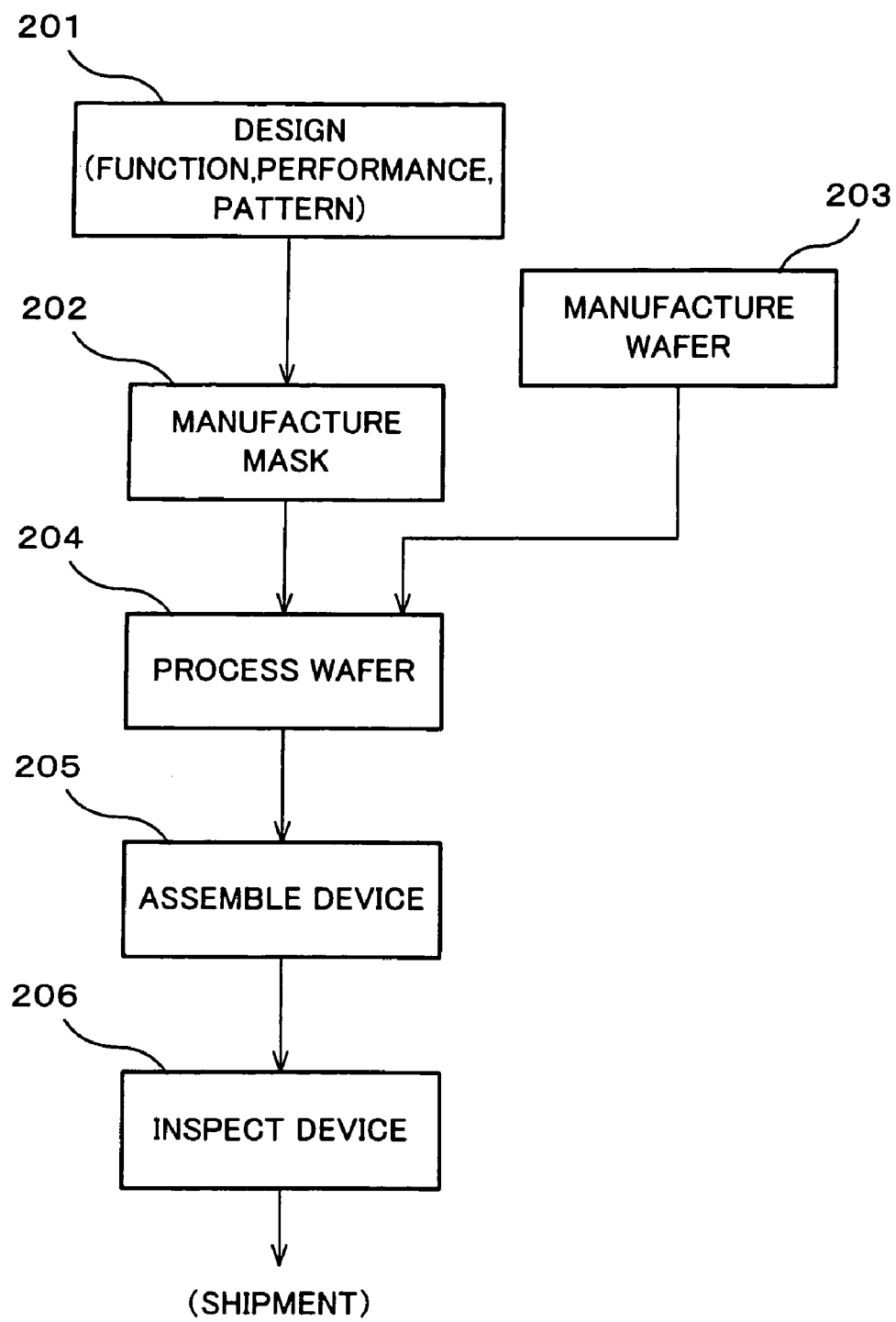
FIG. 6 is a flow chart for explaining an embodiment of a device manufacturing method according to the present invention.

FIG. 6 is a flow chart showing an example of manufacturing a device (a semiconductor chip such as an IC or LSI, a liquid crystal panel, a CCD, a thin magnetic head, a micromachine, or the like). As shown in FIG. 6, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. Next, in step 205 (device assembly step) a device is assembled using the wafer processed in step 204. The step 205 includes processes such as dicing, bonding, and packaging (chip encapsulation), as necessary.

Finally, in step 206 (inspection step), a test on the operation of the device, durability test, and the like are performed. After these steps, the device is completed and shipped out.

Figure 7:
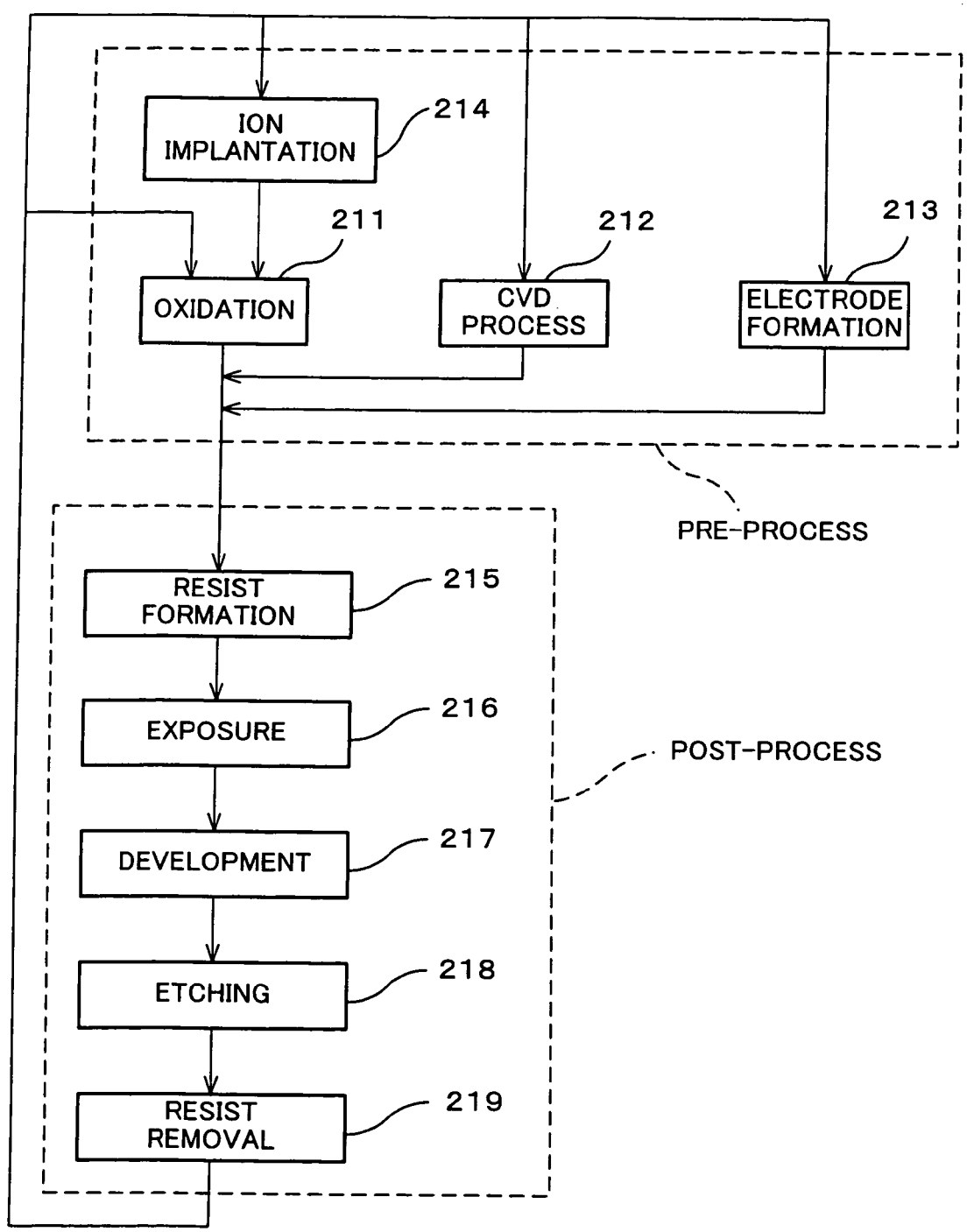
FIG. 7 is a flow chart for showing a process in step 204 in FIG. 6.

FIG. 7 is a flow chart showing a detailed example of step 204 described above in manufacturing the semiconductor device. Referring to FIG. 7, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed based on the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transferred onto the wafer by the exposure apparatus described in the embodiment. Then, in step 217 (developing step), the exposed wafer is developed. In step 218 (etching step), an exposed member of an area other than the area where the resist remains is removed by etching. Finally, in step 219 (resist removing step), when etching is completed, the resist that is no longer necessary is removed.

By repeatedly performing these pre-process and post-process steps, multiple circuit patterns are formed on the wafer.

When using the device manufacturing method described so far in the embodiment, since the exposure apparatus in the above embodiment is used in the exposure process (step 216), the reticle pattern can be transferred onto the wafer precisely for a long period of time. Consequently, productivity of high integration devices (including yield) can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An optical unit that has an optical path of light inside a barrel, said optical unit comprising:
   said barrel;
   a transmissive optical element installed in said barrel and which transmits said light; and
   a first support member attached to said barrel, said first support member having
      a first opposing surface opposing an outer periphery portion of said optical path on a surface of said transmissive optical element, and
      at least three of a first projected portion formed on said first opposing surface and having a height which is around several times with respect to surface accuracy of said first opposing surface so as to keep airtightness of a space formed on a surface side of said transmissive optical element with respect to a space formed on the other surface side of said transmissive optical element.

2. The optical unit of claim 1 wherein
said barrel is at least partly cylindrical including a part where said first support member is attached, and
said transmissive optical element has a circular outer periphery.

3. The optical unit of claim 2 wherein
said first support member has a circular opening formed which makes said optical path, and
said transmissive optical element is arranged in a state where a ring-shaped protruding portion protrudes outside said circular opening.

4. The optical unit of claim 1 wherein said transmissive optical element is a lens element.

5. The optical unit of claim 1 wherein said transmissive optical element is a plate shaped transmissive optical element.

6. The optical unit of claim 1, further comprising:
an exhaust unit that performs forced exhaustion of gas via a space between said transmissive optical element and said first opposing surface of said first support member.

7. The optical unit of claim 6 wherein said exhaust unit has a ring shaped exhaust groove which is formed on said first opposing surface of said first support member and structures a part of a gas exhaust path.

8. The optical unit of claim 1, further comprising:
a second support member which clamps said transmissive optical element with said first support member, said second support member having
a second opposing surface which opposes an outer periphery portion of said optical path on a surface on the other side of said transmissive optical element, and
at least three of a second projected portion arranged on said second opposing surface which contacts with said transmissive optical element at positions opposing said first projected portions.

9. The optical unit of claim 8 wherein said first projected portions and said second projected portions are arranged at a position opposing each other with respect to said transmissive optical element.

10. The optical unit of claim 8 wherein said transmissive optical element is a plate shaped transmissive optical element.

11. The optical unit of claim 8 wherein
said barrel is at least partly cylindrical including a part where said first support member is attached,
said transmissive optical element has a circular outer periphery,
circular openings making said optical path are formed on said first support member and said second support member, respectively, and
said transmissive optical element is arranged in a state so as to form a ring shaped protruded portion protruding outside each of said circular openings.

12. The optical unit of claim 11 wherein said transmissive optical element is a lens element.

13. The optical unit of claim 8, further comprising:
an exhaust unit that performs forced exhaustion of gas via a space between said transmissive optical element and said second opposing surface of said second support member.

14. The optical unit of claim 13 wherein said exhaust unit has a ring shaped exhaust groove which is formed on said second opposing surface of said second support member and structures a part of a gas exhaust path.

15. The optical unit of claim 8 wherein
said first projected portion forms a first clearance in between a surface on one side of said transmissive optical element and said first opposing surface,
said second projected portion forms a second clearance in between a surface on the other side of said transmissive optical element and said second opposing surface, and
said first clearance and said second clearance are a clearance that suppresses gas from flowing in between spaces on one side of said transmissive optical element and the other side of said transmissive optical element.

16. The exposure apparatus of claim 1 wherein said first projected portion has a height which is twice as much with respect to the surface accuracy of said first opposing surface.

17. An exposure apparatus that exposes a substrate with an energy beam to form a predetermined pattern on said substrate, said exposure apparatus comprising:
an optical unit, including a barrel and a first isolating mechanism arranged at said barrel, which is arranged in between said pattern and said substrate to irradiate said energy beam via said pattern onto said substrate, said first isolating mechanism including
a first transmissive optical element installed in said barrel, which transmits said energy beam, and
a first support member having at least three of a first supporting portion, wherein
said first supporting portion is formed on a surface of said first support member opposing an outer periphery portion of an optical path of said energy beam on a surface of said first transmissive optical element, and has a height which is around several times with respect to surface accuracy of the surface of said first support member so as to keep air-tightness of a space formed on a surface side of said first transmissive optical element with respect to a space formed on the other surface side of said first transmissive optical element.

18. The exposure apparatus of claim 17 wherein each of said first supporting portions is a projected portion provided on a surface of said first support member.

19. The exposure apparatus of claim 17 wherein said first isolating mechanism further includes:
a second support member which clamps said first transmissive optical element with said first support member, said second support member having a second supporting portion located at a position opposing each of said first supporting portions.

20. The exposure apparatus of claim 19 wherein each of said second supporting portions is a projected portion provided on a surface of said second support member opposing the other surface side of said first transmissive optical element.

21. The exposure apparatus of claim 17 wherein
said barrel houses a projection optical system which projects said predetermined pattern onto said substrate, and
said first transmissive optical element is arranged on an object surface side of said projection optical system.

22. The exposure apparatus of claim 21 wherein
said optical unit further includes a second isolating mechanism, said second isolating mechanism including
a second transmissive optical element installed in said barrel, and arranged on an image plane side of said projection optical system, and
a second support member having at least three of a second supporting portion wherein
said second supporting portion disposed in between said barrel and an outer periphery portion of said optical path on a surface of said second transmissive optical element has a height where a space formed on a surface side of said second transmissive optical element keeps air-tightness with respect to a space formed on the other surface side of said second transmissive optical element.

23. The exposure apparatus of claim 22 wherein each of said second supporting portions is a projected portion provided on a surface of said second support member opposing said surface side of said second transmissive optical element.

24. The exposure apparatus of claim 22 wherein said second isolating mechanism further includes
a third support member which clamps said second transmissive optical element with said second support member, said third support member having third supporting portions located at positions opposing each of said second supporting portions.

25. The exposure apparatus of claim 24 wherein each of said third supporting portions is a projected portion provided on a surface of said third support member opposing the other side of said surface side of said second transmissive optical element.

26. The exposure apparatus of claim 22, said exposure apparatus further comprising:
a mask chamber connected in a sealed state to said barrel, said mask chamber housing within a mask on which said pattern is formed; and
a substrate chamber connected in a sealed state to said barrel, said substrate chamber housing within a substrate stage on which said substrate is held, wherein
low absorptive gas having low absorptive properties to said energy beam is supplied into each of said barrel, said mask chamber, and said substrate chamber, and
said first isolation mechanism isolates said absorptive gas in between the inside of said barrel and the inside of said mask chamber, while said second isolation mechanism isolates said absorptive gas in between the inside of said barrel and the inside of said substrate chamber.

27. The exposure apparatus of claim 17, said exposure apparatus further comprising:
a mask chamber connected in a sealed state to said barrel, said mask chamber housing within a mask on which said pattern is formed, wherein
low absorptive gas having low absorptive properties to said energy beam is supplied into each of said barrel and said mask chamber, and said first isolation mechanism isolates said absorptive gas in between the inside of said barrel and the inside of said mask chamber.

28. The exposure apparatus of claim 27 wherein
a flange portion that makes a holding member hold said barrel is arranged on a periphery portion of said barrel, and
a partition wall of said mask chamber is connected to said flange portion.

29. The exposure apparatus of claim 27 wherein
a flange portion that makes a holding member hold said barrel is arranged on a periphery portion of said barrel, and
said low absorptive gas is supplied into said barrel via a gas supply path formed in said flange portion.

30. The exposure apparatus of claim 27 wherein said low absorptive gas supplied into said mask chamber and said barrel is a different type of gas.

31. The exposure apparatus of claim 17, said exposure apparatus further comprising:
a substrate chamber connected in a sealed state to said barrel, said substrate chamber housing within a substrate stage on which said substrate is held, wherein
low absorptive gas having low absorptive properties to said energy beam is supplied into each of said barrel and said substrate chamber, and said first isolation mechanism isolates said absorptive gas in between the inside of said barrel and the inside of said substrate chamber.

32. The exposure apparatus of claim 31 wherein
a flange portion that makes a holding member hold said barrel is arranged on a periphery portion of said barrel, and
a partition wall of said substrate chamber is connected to said flange portion.

33. The exposure apparatus of claim 31 wherein said low absorptive gas supplied into said substrate chamber and said barrel is a different type of gas.

34. The exposure apparatus of claim 17 wherein said energy beam belongs to light in vacuum ultraviolet region having a wavelength of 190 nm and under.

35. The exposure apparatus of claim 19 wherein
said first supporting portion forms a first clearance in between a surface on one side of said first transmissive optical element and a first opposing surface opposing an outer periphery portion of said optical path on a surface of said first transmissive optical element,
said second supporting portion forms a second clearance in between a surface on the other side of said first transmissive optical element and a second opposing surface opposing an outer periphery portion of said optical path on a surface on the other side of said first transmissive optical element, and
said first clearance and said second clearance are a clearance that suppresses gas from flowing in between spaces on one side of said first transmissive optical element and the other side of said first transmissive optical element.

36. The exposure apparatus of claim 24 wherein
said second supporting portion forms a first clearance in between a surface on one side of said second transmissive optical element and a first opposing surface opposing an outer periphery portion of said optical path on a surface of said second transmissive optical element,
said third supporting portion forms a second clearance in between a surface on the other side of said second transmissive optical element and a second opposing surface opposing an outer periphery portion of said optical path on a surface on the other side of said second transmissive optical element, and
said first clearance and said second clearance are a clearance that suppresses gas from flowing in between spaces on one side of said second transmissive optical element and the other side of said second transmissive optical element.

37. The exposure apparatus of claim 22 wherein said first transmissive optical element and said second transmissive optical element each comprise lens elements.

38. The exposure apparatus of claim 22 wherein said first transmissive optical element and said second transmissive optical element comprise plate shaped transmissive optical elements.

39. The exposure apparatus of claim 23 wherein said second supporting portion has a height which is around several times with respect to surface accuracy of a surface of said second support member.

40. The exposure apparatus of claim 25 wherein said third supporting portion has a height which is around several times with respect to surface accuracy of a surface of said third support member.

* * * * *